United States Patent
Mitsuya

(10) Patent No.: US 8,928,308 B2
(45) Date of Patent: Jan. 6, 2015

(54) CURRENT SENSOR

(71) Applicant: Alps Green Devices Co., Ltd., Tokyo (JP)

(72) Inventor: Shinji Mitsuya, Miyagi-ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 295 days.

(21) Appl. No.: 13/655,209

(22) Filed: Oct. 18, 2012

(65) Prior Publication Data

US 2013/0099775 A1    Apr. 25, 2013

(30) Foreign Application Priority Data

Oct. 20, 2011    (JP) ................. 2011-230783

(51) Int. Cl.
*G01R 15/20*        (2006.01)
(52) U.S. Cl.
CPC .................................... *G01R 15/207* (2013.01)
USPC .................... 324/126; 324/117 H; 324/117 R
(58) Field of Classification Search
CPC ........ G01R 1/203; G01R 15/16; G01R 15/20; G01R 15/18; G01R 15/183; G01R 15/186; G01R 15/202; G01R 19/0092; G01R 33/0283
USPC ............... 324/126, 127, 76, 115, 149, 117 H, 324/117 R; 333/24; 338/49
See application file for complete search history.

(56) References Cited

U.S. PATENT DOCUMENTS

| | | | |
|---|---|---|---|
| 6,825,650 B1 * | 11/2004 | McCormack et al. | 324/127 |
| 7,719,258 B2 * | 5/2010 | Chen et al. | 324/117 H |
| 8,466,590 B2 * | 6/2013 | Hauser et al. | 310/68 B |
| 2006/0071655 A1 * | 4/2006 | Shoji | 324/117 H |
| 2010/0315928 A1 * | 12/2010 | Zhou et al. | 369/53.38 |
| 2012/0290240 A1 * | 11/2012 | Fukui | 702/65 |
| 2013/0063129 A1 * | 3/2013 | Chamarti et al. | 324/126 |

FOREIGN PATENT DOCUMENTS

JP    2007-107972    4/2007

* cited by examiner

*Primary Examiner* — Arleen M Vazquez
*Assistant Examiner* — Dominic Hawkins
(74) *Attorney, Agent, or Firm* — Beyer Law Group LLP

(57) ABSTRACT

A current sensor includes a first support configured to include a cutout portion, a first magnetic detector element group configured to be provided in the first support, a second support configured to include a cutout portion, and a second magnetic detector element group configured to be provided in the second support. The cutout portion includes a supporting surface supporting a current line. In the current sensor, when the current line conducting therethrough a current to be measured is attached, the first support and the second support are displaced in the circumferential direction of the current line and fixed, and the current line is supported by supporting surfaces, in different positions in the axis line direction of the corresponding current line.

12 Claims, 16 Drawing Sheets

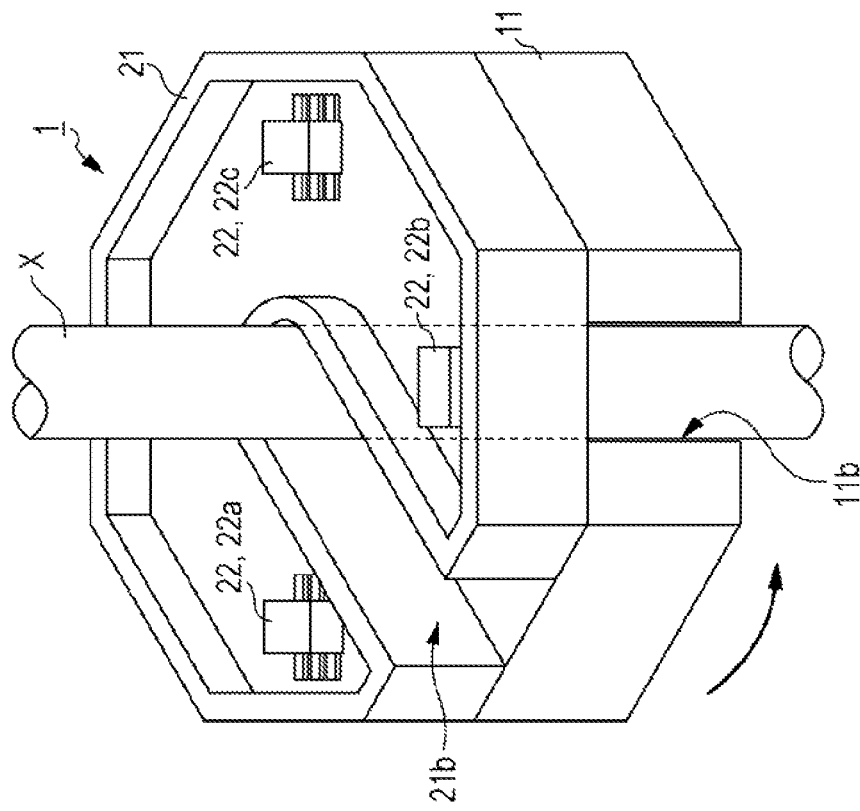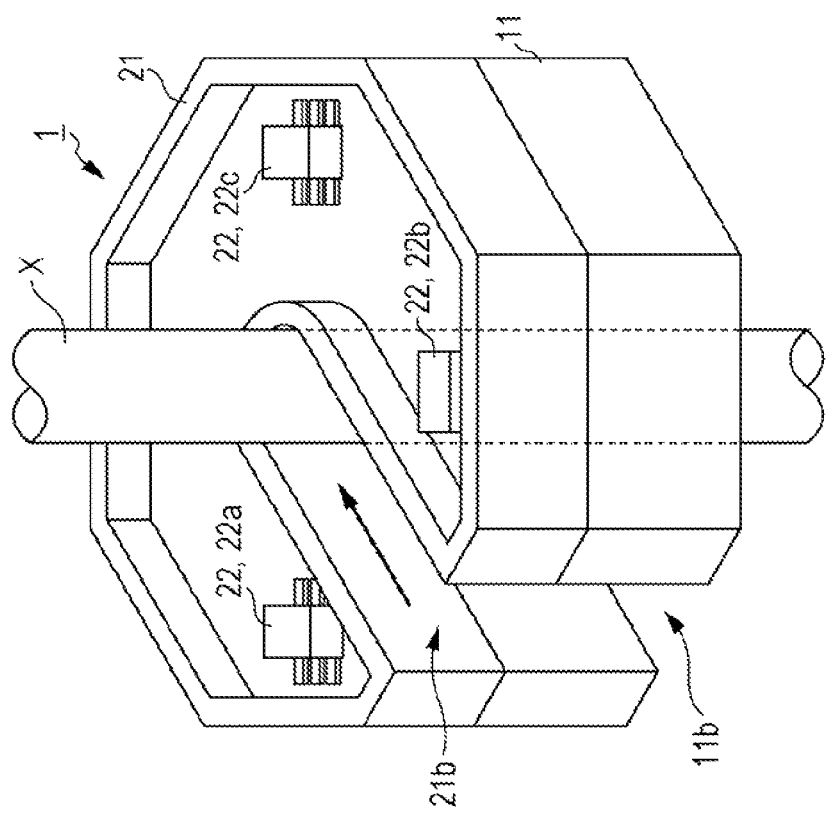

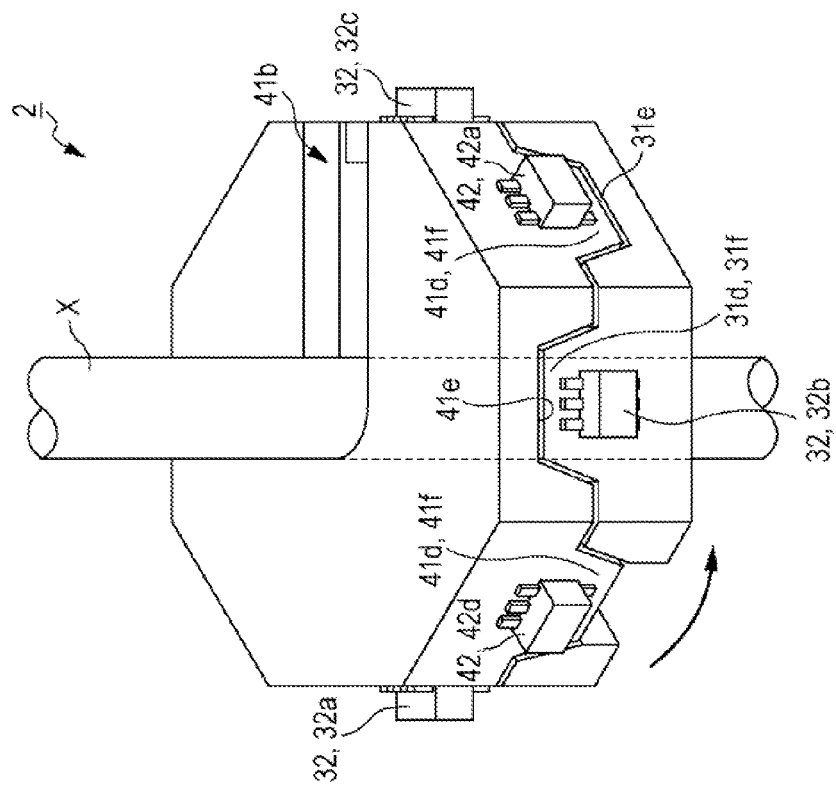
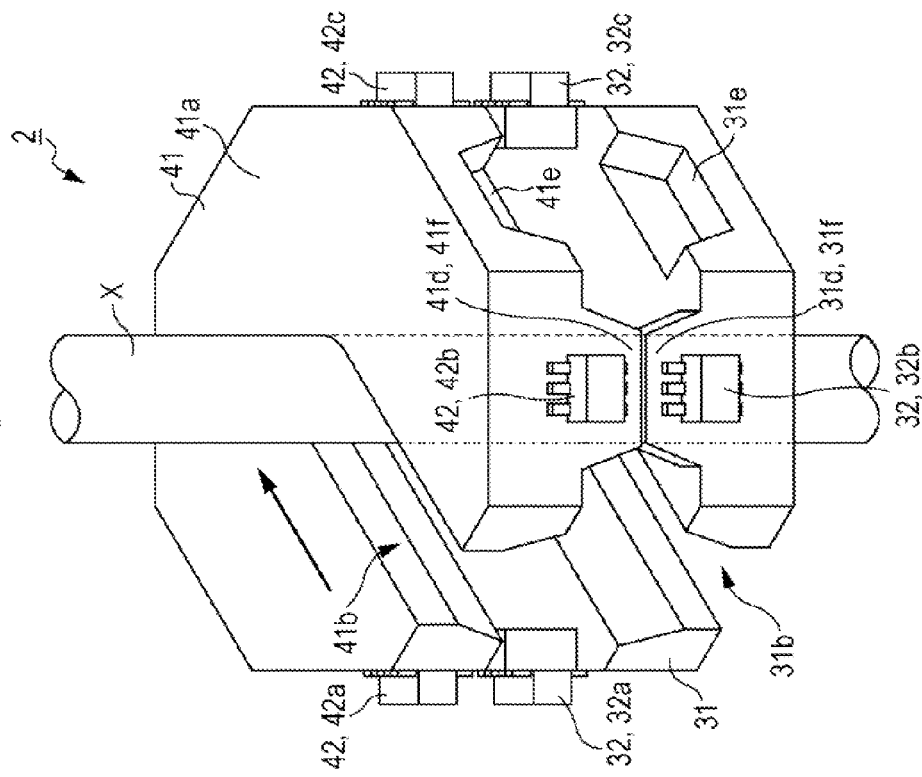

CURRENT SENSOR

CLAIM OF PRIORITY

This application claims benefit of Japanese Patent Application No. 2011-230783 filed on Oct. 20, 2011, which is hereby incorporated by reference.

BACKGROUND OF THE INVENTION

1. Field of the Invention

The present invention relates to a current sensor for measuring a current to be measured that is conducted through a current line, and relates to, for example, a current sensor equipped with a magnetic detector element.

2. Description of the Related Art

In the field of technologies for driving motors in electric vehicles, hybrid vehicles, and the like, since relatively large currents are handled, a current sensor is desirable that is capable of contactlessly measuring a large current. As such a current sensor, a current sensor has been proposed that detects a change in a magnetic field occurring owing to a current to be measured, using a plurality of magnetic sensors.

The current sensor includes a substrate, in which a cutout is provided so as to be headed from an outer edge portion to a central portion, and a plurality of magnetic sensors circularly provided on the substrate with the central portion of the substrate serving as the center thereof. In a current sensor described in Japanese Unexamined Patent Application Publication No. 2007-107972, a current to be measured is measured on the basis of the total value of output signals individually output from magnetic sensors owing to an induction magnetic field from the current to be measured that is conducted through a current line.

SUMMARY OF THE INVENTION

In a current sensor, so as to enhance the measurement accuracy of a current to be measured, it is desirable to control positional accuracy between a current line and a magnetic sensor with a high level. In the current sensor described in Japanese Unexamined Patent Application Publication No. 2007-107972, the current line is led into the central portion of a plurality of magnetic sensors circularly provided, through a cutout portion, and using the total value of output signals output from the plural magnetic sensors provided around the current line, a change in the total value of the output signals of the magnetic sensors is reduced when positional accuracy between the current line and each of the magnetic sensors is out of alignment.

However, in the current sensor described in Japanese Unexamined Patent Application Publication No. 2007-107972, when a large number of magnetic sensors are provided that are used for enhancing the measurement accuracy and the detection sensitivity of the current to be measured, a gap used for providing a cutout portion leading the current line onto a substrate becomes insufficient. Therefore, there occurs a problem that it is difficult to lead the current line into the central portion of the plural magnetic sensors. In addition, since it is difficult to provide a magnetic sensor in the cutout portion provided in the substrate, there occurs a problem that the symmetry property of a positional relationship between the plural magnetic sensors is reduced with respect to the current line and the measurement accuracy is lowered with an increase in the number of magnetic sensors.

The present invention provides a current sensor having high measurement accuracy and a high detection sensitivity and attachable and detachable to and from a current line.

A current sensor according to preferred embodiments of the present invention includes a first support configured to include a first cutout portion leading a current line conducting therethrough a current to be measured and a first supporting surface being provided in the first cutout portion and supporting the current line led from the first cutout portion, a second support configured to be fixed on the first support so as to be rotatable in a circumferential direction of the current line, and include a second cutout portion leading the current line and a second supporting surface being provided in the second cutout portion and supporting the current line led from the second cutout portion, a first magnetic detector element group configured to be provided in the first support and include a plurality of magnetic detector elements outputting output signals owing to an induction magnetic field from the current to be measured, and a second magnetic detector element group configured to be provided in the second support and include a plurality of magnetic detector elements outputting output signals owing to the induction magnetic field, wherein the first and second supports lead the current line into the first and second supporting surfaces in a state where the first and second cutout portions are connected and superimposed to and on each other, and when the current line is attached, the first and second supporting surfaces are fixed so as to support positions of the current line different from each other in an axis line direction of the current line from directions different from each other.

According to this configuration, since the first cutout portion is provided in the first support, the second cutout portion is provided in the second support, and the second support is fixed on the first support so as to be rotatable in the circumferential direction of the current line, it may be possible to lead the current line into the first supporting surface and the second supporting surface by rotating the first and second supports in the circumferential direction of the current line and causing the first and second cutout portions to be connected to each other. Furthermore, by fixing the first support and the second support so that the different positions of the current line led into the first and second supporting surfaces from the different directions, it may be possible to attach the current sensor to an existing current line. In addition, since the first support in which the first magnetic detector element group is provided and the second support in which the second magnetic detector element group is provided are fixed to the current line, it may be possible to reduce a change in the total value of output signals of the magnetic detector elements when positional accuracy between the current line and the first and second magnetic detector elements is out of alignment. Accordingly, it may be possible to realize the current sensor that has high measurement accuracy and a high detection sensitivity and is attachable and detachable to and from the current line.

In the current sensor according to preferred embodiments of the present invention, it is desirable that the plural magnetic detector elements belonging to the first magnetic detector element group and the plural magnetic detector elements belonging to the second magnetic detector element group are provided at equal intervals in the circumferential direction of the current line. According to this configuration, it may be possible to avoid the deterioration of measurement accuracy even if the current line is displaced in any direction.

In the current sensor according to preferred embodiments of the present invention, it is desirable that the first support includes a convex portion and a concave portion that are provided in an outer circumferential portion of the first support, the second support includes a convex portion and a concave portion that are provided in an outer circumferential portion of the second support, the individual magnetic detector elements belonging to the first magnetic detector element group are provided in a lateral surface of the convex portion in the first support, the individual magnetic detector elements belonging to the second magnetic detector element group are provided in a lateral surface of the convex portion of the second support, and when the current line is attached, the first and second supports are engaged with each other and fixed in the convex portion and the concave portion in the first and second supports, and the first and second magnetic detector element groups are mutually provided on a same circumference of circle. According to this configuration, even if the current line tilts, a direction and a distance where the current line is displaced with respect to the first magnetic detector element group are substantially the same as those with respect to the second magnetic detector element group, it may be possible to avoid the deterioration of the measurement accuracy of the current sensor.

In the current sensor according to preferred embodiments of the present invention, it is desirable that the first support includes a convex portion and a concave portion that are provided in an outer circumferential portion of the first support and a first inner wall portion provided in the circumferential direction of the current line, the second support includes a convex portion and a concave portion that are provided in an outer circumferential portion of the second support and a second inner wall portion provided in the circumferential direction of the current line, a radius of the first inner wall portion is larger than a radius of the second inner wall portion, the individual magnetic detector elements belonging to the first magnetic detector element group are provided on an inside of the first inner wall portion, the individual magnetic detector elements belonging to the second magnetic detector element group are provided on an outside of the second inner wall portion, and when the current line is attached, the first and second supports are engaged with each other and fixed in the convex portion and the concave portion in the first and second supports, and the first and second magnetic detector element groups are provided on a same circumference of circle. According to this configuration, even if the current line tilts, a direction and a distance where the current line is displaced with respect to the first magnetic detector element group are substantially the same as those with respect to the second magnetic detector element group, it may be possible to avoid the deterioration of the measurement accuracy of the current sensor.

In the current sensor according to preferred embodiments of the present invention, it is desirable that the plural magnetic detector elements belonging to the first magnetic detector element group and the plural magnetic detector elements belonging to the second magnetic detector element group are provided at equal intervals in the circumferential direction of the current line. According to this configuration, it may be possible to avoid the deterioration of measurement accuracy even if the current line is displaced in any direction.

In the current sensor according to preferred embodiments of the present invention, it is desirable that the first magnetic detector element group includes four magnetic detector elements provided so as to face each other with being mutually located at equal distances from the current line, and the second magnetic detector element group includes four magnetic detector elements provided so as to face each other with being mutually located at equal distances from the current line. According to this configuration, since the total number of magnetic detector elements becomes eight, it may be possible to desirably suppress an increase in a manufacturing cost or an increase in the size of the current sensor, associated with an increase in the number of the magnetic detector elements, while it may be possible to reduce a measurement error when the current line is displaced and it may be possible to desirably enhance the measurement accuracy.

In the current sensor according to preferred embodiments of the present invention, it is desirable that the first and second supporting surfaces form circumferential surfaces following an outer peripheral surface of the current line and when the current line is attached, the first and second supports are fixed so that the first and second cutout portions are out of phase with each other by at least 90 degrees in the circumferential direction of the current line. According to this configuration, since the first and second supporting surfaces forming circumferential surfaces following an outer peripheral surface of the current line support the current line from directions out of phase with each other by at least 90 degrees, a range surrounded by the first or second supporting surface becomes narrower than a square shape circumscribed by a circle whose radius is equal to a circular arc formed by the supporting surfaces. Accordingly, it may be possible to fix the current line with accuracy, and it may be possible to further improve the measurement accuracy of the current sensor.

It is desirable that the current sensor according to preferred embodiments of the present invention further includes a third support configured to include a third cutout portion leading the current line conducting therethrough the current to be measured and a third supporting surface being provided in the third cutout portion and supporting the current line led from the third cutout portion, and a third magnetic detector element group configured to be provided in the third support and include a plurality of magnetic detector elements outputting output signals owing to the induction magnetic field, wherein the first, second, and third supports lead the current line into the first, second, and third supporting surfaces in a state where the first, second, and third cutout portions are connected and superimposed to and on each other, and when the current line is attached, the first, second, and third supporting surfaces are fixed so as to support positions of the current line different from one another in the axis line direction of the current line from directions different from one another. According to this configuration, since output signals are also obtained from the individual magnetic detector elements belonging to the third magnetic detector element group in addition to the individual magnetic detector elements belonging to the first and second magnetic detector element groups, it may be possible to improve the detection sensitivity and the measurement accuracy of the current sensor.

In the current sensor according to preferred embodiments of the present invention, it is desirable that the plural magnetic detector elements belonging to the third magnetic detector element group are provided at equal intervals in the circumferential direction of the current line. According to this configuration, it may be possible to avoid the deterioration of measurement accuracy even if the current line is displaced in any direction.

In the current sensor according to preferred embodiments of the present invention, it is desirable that the third magnetic detector element group includes four magnetic detector elements provided so as to face each other across the current line with being mutually located at equal distances from the current line. According to this configuration, it may be possible to reduce a measurement error when the current line is displaced, and it may be possible to obtain high measurement accuracy.

In the current sensor according to preferred embodiments of the present invention, it is desirable that the first, second, and third supporting surfaces form circumferential surfaces following an outer peripheral surface of the current line, and when the current line is attached, the first, second, and third supports are fixed so that the first, second, and third cutout portions are out of phase with each other by at least 90 degrees in the circumferential direction of the current line. According to this configuration, since the shape of a connection hole becomes a circular shape, the connection hole being formed by the first, second, and third supporting surfaces forming circumferential surfaces following the outer peripheral surface of the current line, it may be possible to fix the current line with accuracy, and it may be possible to further improve the measurement accuracy of the current sensor.

BRIEF DESCRIPTION OF THE DRAWINGS

FIGS. 5A and 5B are explanatory diagrams of examples of attachment of a current line to the current sensor according to the above-mentioned embodiment;

FIGS. 12A and 12B are explanatory diagrams of examples of attachment of the current sensor according to the above-mentioned embodiment to a current line;

DESCRIPTION OF THE PREFERRED EMBODIMENTS

Figure 1:
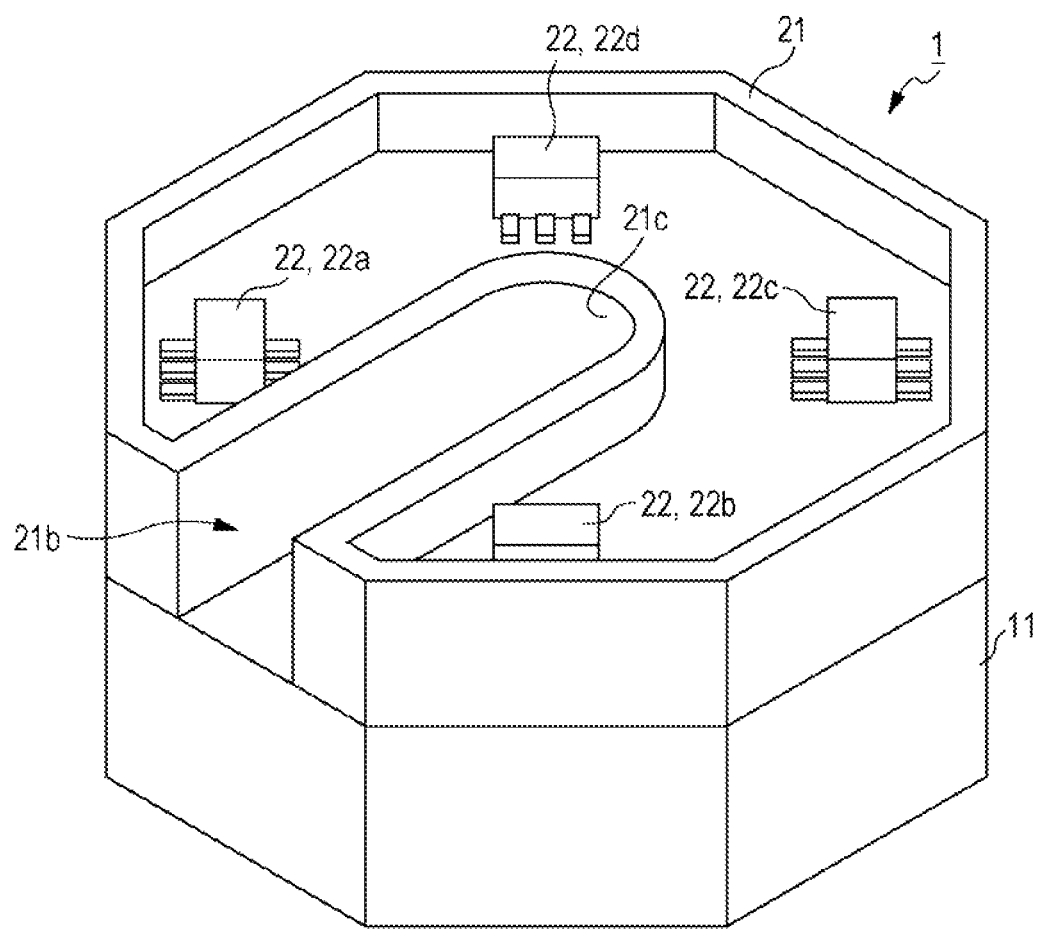
FIG. 1 is an external appearance perspective view of a current sensor according to a first embodiment.

In recent years, the use of current sensors has widened, and a current sensor attachable and detachable to and from an existing current line has been desired. In a current sensor contactlessly measuring a current to be measured that is conducted through a current line, a plurality of magnetic detector elements are provided around the current line conducting therethrough the current to be measured, and the contour integration of output signals from individual magnetic detector elements is obtained, and hence it may be possible to measure the current to be measured.

On the other hand, in the current sensor contactlessly measuring the current to be measured that is conducted through the current line, if a relative positional relationship between the current line and the magnetic detector element is slightly out of alignment, a large measurement error occurs. The reason is that the intensity of an induction magnetic field the magnetic detector element receives is determined with a distance from the current to be measured functioning as a parameter, the current to be measured serving as the source of the induction magnetic field. Therefore, in the current sensor attachable and detachable to and from an existing current line, so as to enhance measurement accuracy, it is desirable to control a relative positional relationship between the current line and each magnetic detector element and positional accuracy with a high level when the current line is attached.

The present inventor focused attention on a configuration where a plurality of magnetic detector element groups are provided on a support including a cutout portion. In such a support, a current line is led into the inside of the cutout portion, and an induction magnetic field from a current to be measured that is conducted through the current line is detected using the plural magnetic detector element groups. Accordingly, even if a distance between the current line and each magnetic detector element is slightly out of alignment, it may be possible to reduce a change in the total value of output signals and it may be possible to suppress the reduction of the measurement accuracy. In addition, since each magnetic detector element is provided on the support, even if the current line is slightly out of alignment in the cutout portion, the relative positional relationship between the current line and each magnetic detector element is maintained. Therefore, it may be possible to suppress the reduction of the measurement accuracy of the current sensor.

The present inventor found out that, using a pair of supports each of which includes a cutout portion and on each of which a plurality of magnetic detector elements are provided and by fixing one magnetic detector element group and another magnetic detector element group with the one magnetic detector element group and the other magnetic detector element group being displaced from each other in the circumferential direction of a current line, the one magnetic detector element group being provided on one support, the other magnetic detector element group being provided on the other support, it may be possible to support the different positions of the current line from different directions and it may be possible to realize a current sensor attachable and detachable to and from an existing current line. In addition, the present inventors found out that, by fixing the one magnetic detector element group and the other magnetic detector element group with the one magnetic detector element group and the other magnetic detector element group being displaced from each other in the circumferential direction of a current line, the one magnetic detector element group being provided on the one support, the other magnetic detector element group being provided on the other support, even if a plurality of magnetic elements are provided, it may be possible to hold relative positional relationships of magnetic detector elements belonging to each magnetic detector element group with respect to the current line, and the present inventors completed the present invention.

Hereinafter, embodiments of the present invention will be described in detail with reference to accompanying drawings.

(First Embodiment)

Figure 2:
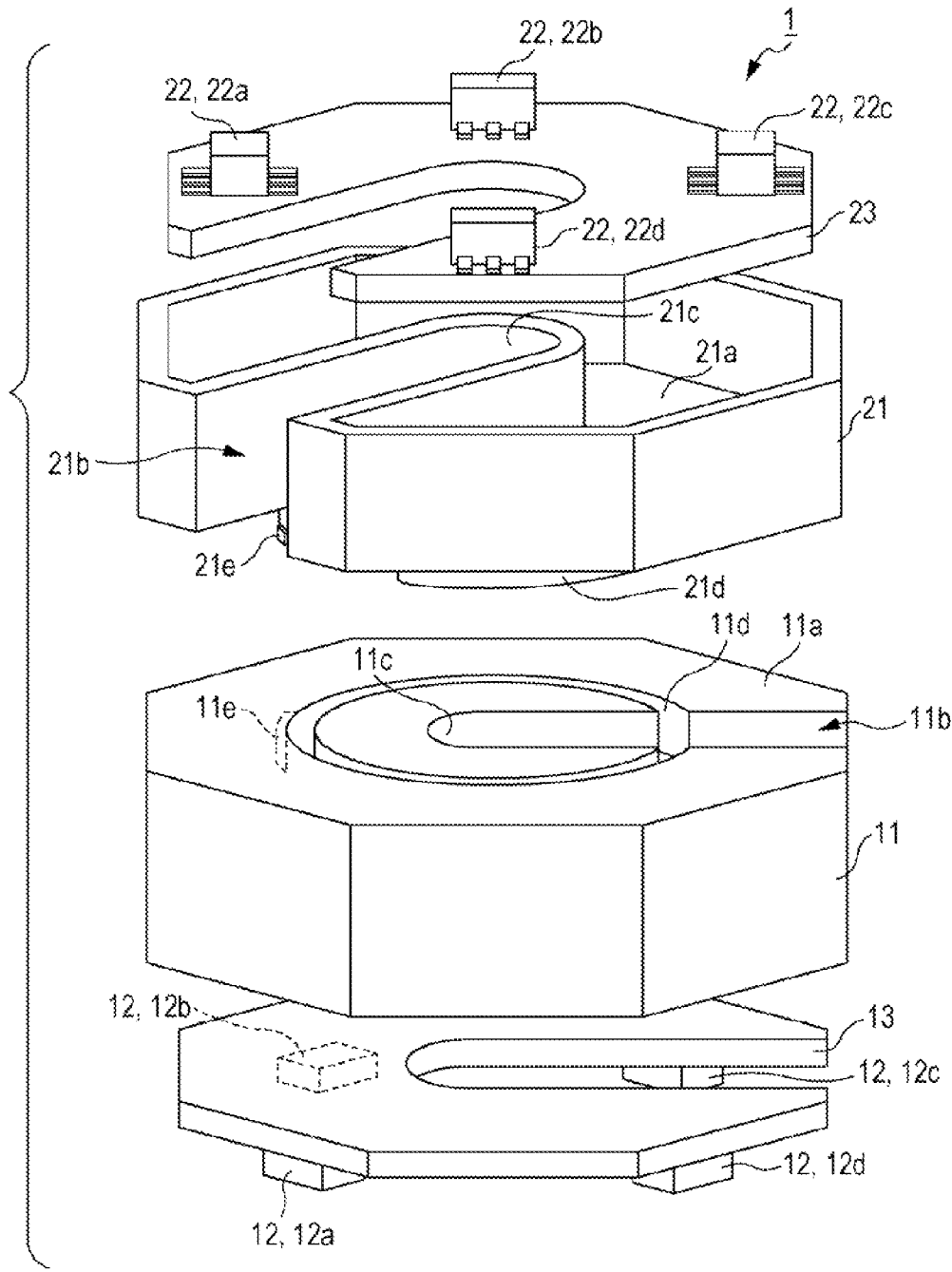
FIG. 2 is an exploded perspective view of the current sensor according to the above-mentioned embodiment.

FIG. 1 is the external appearance perspective view of a current sensor according to a first embodiment. FIG. 2 is the exploded perspective view of the current sensor according to the present embodiment. In addition, for convenience of explanation, it is assumed that each of front-back, vertical, and horizontal directions is in accordance with a direction illustrated in FIG. 1.

As illustrated in FIG. 1 and FIG. 2, a current sensor 1 according to the present embodiment includes a first support 11, a second support 21 fixed on the first support 11 so as to be rotatable in a horizontal direction (the circumferential direction of a current line X: refer to FIGS. 5A and 5B), a first magnetic detector element group 12 including a plurality of magnetic detector elements that are provided on the first support 11 and output output signals owing to an induction magnetic field from a current to be measured, and a second magnetic detector element group 22 including a plurality of magnetic detector elements that are provided on the second support 21 and output output signals owing to the induction magnetic field from the current to be measured. Individual magnetic detector elements belonging to the first magnetic detector element group 12 and the second magnetic detector element group 22 are provided in the circumferential direction of the current line X. The first magnetic detector element group 12 is provided on the bottom surface side of the first support 11, and the second magnetic detector element group 22 is provided on the top surface side of the second support 21.

The first support 11 includes a support base portion 11a having a substantially plate shape and a cutout portion 11b provided so as to be headed from the outer circumferential portion of the support base portion 11a to the central portion thereof. The cutout portion 11b has a width dimension slightly larger than the width of the current line X conducting therethrough the current to be measured, and is provided so as to lead the current line X from the outer circumferential portion of the support base portion 11a toward the central portion thereof. In addition, on the bottom surface side of the support base portion 11a, a substrate-housing space (not illustrated) is formed. This shape of the substrate-housing space (a shape viewed from above the plane of paper of FIG. 2) is similar to the shape of the support base portion 11a (a shape viewed from above the plane of paper of FIG. 2).

In the cutout portion 11b, a supporting surface 11c is provided that extends from the side wall of the support base portion 11a and supports the current line X led into the inside of the cutout portion 11b. In the present embodiment, the supporting surface 11c is formed as a circumferential surface having a substantially semicircular shape in planar view, so as to have a shape following the outer peripheral surface of the current line X whose cross-section has a substantially circular shape. In addition, while being described in detail later, when the current line X is attached to the current sensor 1, a portion of the outer peripheral surface of the current line X is supported by the supporting surface 11c and positioned in a radial direction. In addition, in the support base portion 11a, a circular concave portion 11d is provided that is dented from the top surface thereof downward. This concave portion 11d is formed with a size being large enough for a convex portion 21d in a support base portion 21a described below to be inserted into so as to be movable in the concave portion 11d.

On the bottom surface side of the support base portion 11a, the first magnetic detector element group 12 is provided through an insulating substrate 13. The insulating substrate 13 has a similar shape slightly smaller than the shape of the substrate-housing space that is provided on the bottom surface side of the support base portion 11a and open into a lower side, and the insulating substrate 13 is placed within the substrate-housing space. The first magnetic detector element group 12 includes four magnetic detector elements 12a to 12d outputting output signals owing to the induction magnetic field from the current to be measured that is conducted through the current line X. The four magnetic detector elements 12a to 12d belonging to the first magnetic detector element group 12 are provided at substantially equal intervals (substantially equal distances) in the circumferential direction of the current line X (refer to FIG. 4A). The individual magnetic detector elements 12a to 12d are electrically connected through a wiring pattern (not illustrated). In addition, each of the magnetic detector elements 12a to 12d may have an attachment error not large enough to greatly deteriorate measurement accuracy.

The second support 21 includes a support base portion 21a having a substantially plate shape and a cutout portion 21b provided so as to be headed from the outer circumferential portion of the support base portion 21a to the central portion thereof. The cutout portion 21b has a width dimension slightly larger than the diameter of the current line X, and is provided so as to lead the current line X from the outer circumferential portion of the support base portion 21a toward the central portion thereof. In addition, on the top surface side of the support base portion 21a, a substrate-housing space is formed. This shape of the substrate-housing space (a shape viewed from above the plane of paper of FIG. 2) is similar to the shape of the support base portion 21a (a shape viewed from above the plane of paper of FIG. 2).

In the cutout portion 21b, a supporting surface 21c is provided that extends from the side wall of the support base portion 21a and supports the current line X led from the outer peripheral edge of the support base portion 11a into the inside of the cutout portion 21b. In the present embodiment, the supporting surface 21c is formed as a circumferential surface having a substantially semicircular shape in planar view, so as to have a complementary shape following the outer peripheral surface of the current line X whose cross-section has a substantially circular shape. In addition, while being described in detail later, when the current line X is attached to the current sensor 1, a portion of the outer peripheral surface of the current line X is supported by the supporting surface 21c and positioned. In addition, in the support base portion 21a, a convex portion 21d is provided that protrudes from the bottom surface thereof downward. This convex portion 21d is formed with a size being able to be inserted into the concave portion 11d in the above-mentioned support base portion 11a.

On the top surface side of the support base portion 21a, the second magnetic detector element group 22 is provided through an insulating substrate 23. The insulating substrate 23 has a similar shape slightly smaller than the shape of the substrate-housing space that is provided on the top surface side of the support base portion 21a, and the insulating substrate 23 is placed within the substrate-housing space. The second magnetic detector element group 22 includes four magnetic detector elements 22a to 22d outputting output signals owing to the induction magnetic field from the current to be measured that is conducted through the current line X. The four magnetic detector elements 22a to 22d belonging to the second magnetic detector element group 22 are provided at substantially equal intervals (substantially equal distances) in the circumferential direction of the current line X. The individual magnetic detector elements 22a to 22d are electrically connected through a wiring pattern (not illustrated). In addition, each of the magnetic detector elements 22a to 22d may have an attachment error not large enough to greatly deteriorate measurement accuracy.

In the current sensor 1 according to the present embodiment, the first and second supports 11 and 21 are fixed in a state where the first and second supports 11 and 21 mutually rotate with the axis line direction of the current line X serving as a rotation axis and the first and second cutout portions 11b and 21b are connected and superimposed to and on each other. At this time, a state occurs where the convex portion 21d in the second support 21 fits into the concave portion 11d in the first support base portion 11a. In this state, the current line X is led into the first and second supporting surfaces 11c and 21c. In addition, in a state where the current line X comes into contact with the first and second supporting surfaces 11c and 21c, the first and second supports 11 and 21 mutually rotate with the axis line direction of the current line X serving as a rotation axis. At this time, the convex portion 21d in the second support 21 moves in a rotation direction in a state where the convex portion 21d in the second support 21 fits into the concave portion 11d in the first support base portion 11a. In addition, in the axis line direction of the current line X, the first and second supporting surfaces 11c and 21c are fixed so as to support the positions of the current line X different from each other from different directions, and attached to the current line X.

Figure 3A:
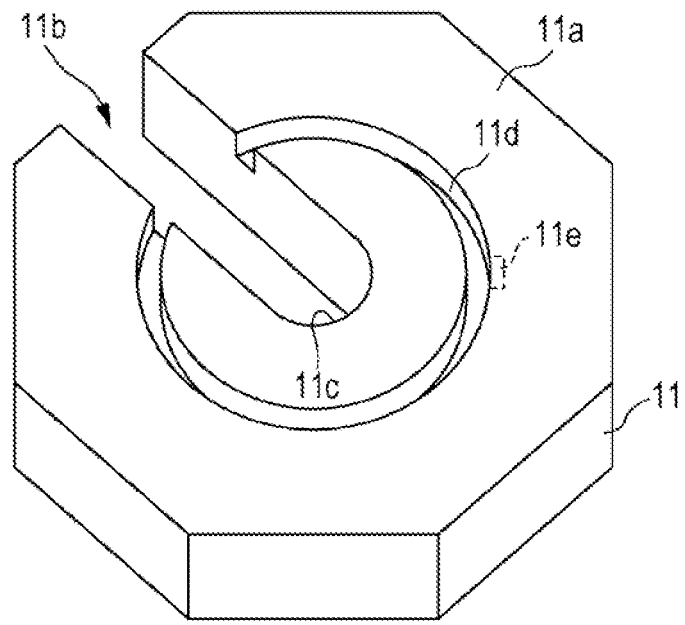
FIGS. 3A and 3B are external appearance perspective views illustrating a top surface side of a first support and a bottom surface side of a second support in the current sensor according to the above-mentioned embodiment.
Figure 3B:
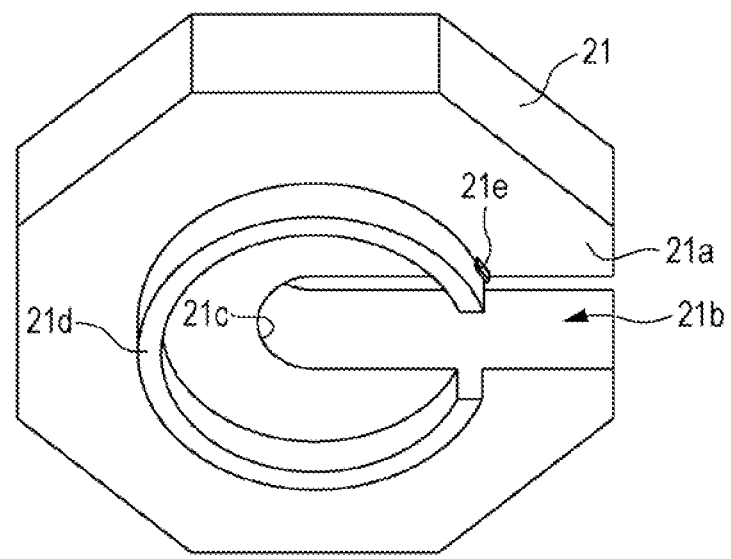

FIG. 3A is an external appearance perspective view illustrating the top surface side of the first support 11, and FIG. 3B is an external appearance perspective view illustrating the bottom surface side of the second support 21. As illustrated in FIG. 3A, on the top surface side of the support base portion 11a, in the circumferential direction of the current line X, the circular concave portion 11d is provided that is dented from the top surface of the support base portion 11a downward. This concave portion 11d is formed so as to fit into the convex portion 21d in the second support 21 described later. In addition, in the concave portion 11d, a connection point 11e is provided that fits into a connection point 21e of the convex portion 21d in the second support 21 described later.

As illustrated in FIG. 3B, on the bottom surface side of the support base portion 21a, in the circumferential direction of the current line X, the circular convex portion 21 d is provided that protrudes from the bottom surface of the support base portion 21a downward and has a shape complementary to the concave portion 11d. This convex portion 21d is provided so as to fit into the concave portion 11d in the first support 11. In addition, in the convex portion 21d, the connection point 21e is provided that fits into the connection point 11e provided in the concave portion 11d in the first support 11. The second connection point 21e is provided so as to fit into the first connection point 11e and electrically establish a connection between the first magnetic detector element group 12 and the second magnetic detector element group 22 when the current line X is attached to the first and second supports 11 and 21.

Figure 4A:
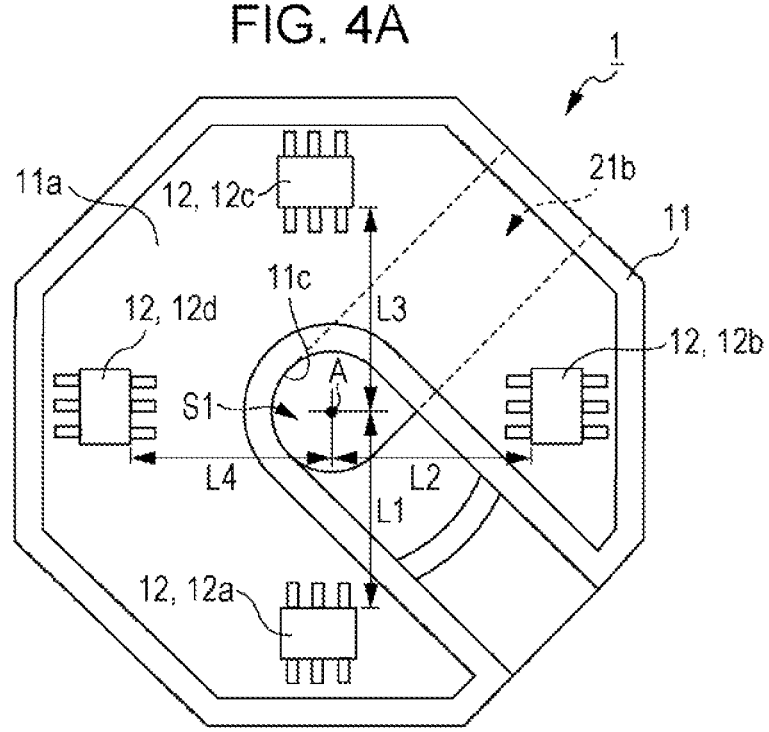
FIGS. 4A and 4B are plan views of the first support and the second support in the current sensor according to the above-mentioned embodiment.
Figure 4B:
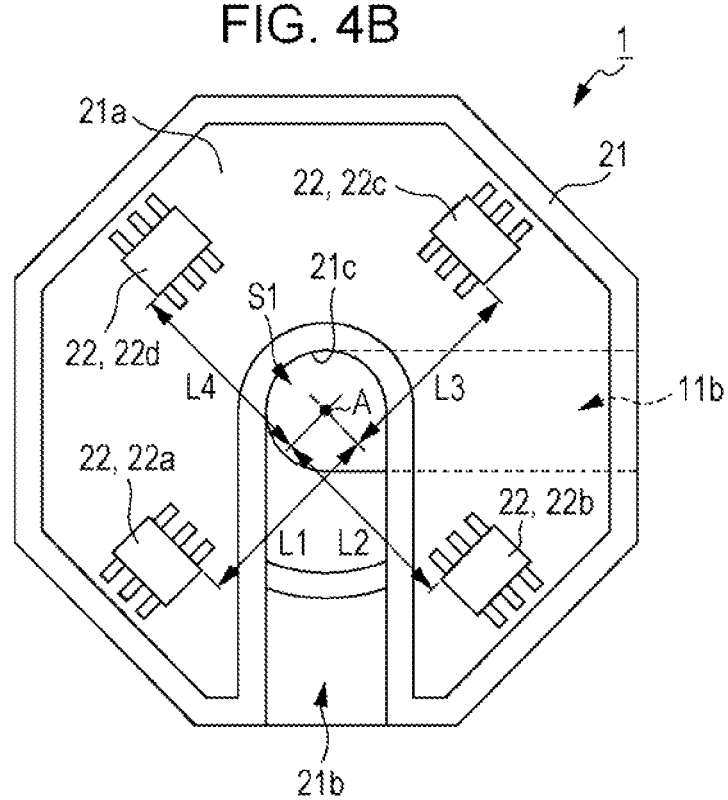

Next, with reference to FIGS. 4A and 4B, the disposition of the first and second magnetic detector element groups will be described in detail. FIGS. 4A and 4B are the plan views of the first support and the second support.

As illustrated in FIG. 4A, the four magnetic detector elements 12a to 12d belonging to the first magnetic detector element group 12 are provided in the circumferential direction of the current line X so that intervals between the individual magnetic detector elements 12a to 12d adjacent to each other are substantially equal intervals (substantially equal distances) with respect to each other. In the present embodiment, one pair of the magnetic detector elements 12a and 12c is provided so as to face each other across the axis A of the current line X, and the other pair of the magnetic detector elements 12b and 12d is provided so as to face each other across the axis A of the current line X and be perpendicular to the pair of the magnetic detector elements 12a and 12c. The individual magnetic detector elements 12a to 12d are provided so that distances L1 to L4 between the axis A of the current line X and the individual magnetic detector elements 12a to 12d are substantially equal distances with respect to one another. By providing in such a way, the individual magnetic detector elements 12a to 12d are provided on the first support 11 at intervals of approximately 90 degrees with respect to each other in the circumferential direction of the current line X. In addition, the pair of the magnetic detector elements 12a and 12c and the other pair of the magnetic detector elements 12b and 12d may not be necessarily provided so as to face each other across the axis A.

As illustrated in FIG. 4B, the four magnetic detector elements 22a to 22d belonging to the second magnetic detector element group 22 are provided in the circumferential direction of the current line X so that intervals between the individual magnetic detector elements 22a to 22d adjacent to each other are substantially equal intervals (substantially equal distances) with respect to each other. In the present embodiment, one pair of the magnetic detector elements 22a and 22c is provided so as to face each other across the axis A of the current line X, and the other pair of the magnetic detector elements 22b and 22d is provided so as to face each other across the axis A of the current line X and be perpendicular to the pair of the magnetic detector elements 22a and 22c. The individual magnetic detector elements 22a to 22d are provided so that distances L1 to L4 between the axis A of the current line X and the individual magnetic detector elements 22a to 22d are substantially equal distances with respect to one another. By providing in such a way, the individual magnetic detector elements 22a to 22d are provided on the second support 21 at intervals of approximately 90 degrees with respect to each other in the circumferential direction of the current line X.

In the current sensor 1 according to the present embodiment, it is desirable that the first and second supports 11 and 21 are fixed so that the magnetic detector elements 12a to 12d belonging to the first magnetic detector element group 12 and the magnetic detector elements 22a to 22d belonging to the second magnetic detector element group 22 are out of phase with each other by approximately 45 degrees in the circumferential direction of the current line X when the current line X is attached to the first and second supports 11 and 21. Accordingly, since the relative positional relationships of the individual magnetic detector elements 12a to 12d belonging to the first magnetic detector element group 12 with respect to the current line X and the relative positional relationships of the individual magnetic detector elements 22a to 22d belonging to the second magnetic detector element group 22 with respect to the current line X are approximately equal to each other, it may be possible to realize a current sensor having high measurement accuracy.

In addition, in the current sensor 1 according to the present embodiment, it is desirable that when the current line X is attached, the first and second supports 11 and 21 are fixed so that the cutout portions 11b and 21b in the first and second supports 11 and 21 are out of phase with each other by at least 90 degrees in the circumferential direction of the current line X. Accordingly, owing to the supporting surfaces 11c and 21c of the first and second supports 11 and 21 forming circumferential surfaces along the outer peripheral surface of the current line X, the shape of a connection hole S1 formed by the cutout portions 11b and 21b in the first and second supports 11 and 21 becomes a substantially circular shape in planar view (refer to FIG. 4A and FIG. 4B). As a result, when the current line X is attached to the first and second supports 11 and 21, the current line X is supported along the outer peripheral surface thereof by the supporting surfaces 11c and 21c in the first and second supports 11 and 21 from directions different from each other by at least 90 degrees. Therefore, positional accuracy between the current line X and each of the magnetic detector elements 12a to 12d and 22a to 22d may be improved when the current line X is attached to the first and second supports 11 and 21. Accordingly, it may be possible to further improve the measurement accuracy of the current sensor 1.

Next, with reference to FIGS. 5A and 5B, examples of attachment of the current sensor 1 according to the present embodiment to the current line X will be described. FIGS. 5A and 5B are explanatory diagrams of examples of attachment of the current line X to the current sensor 1 according to the above-mentioned embodiment. Here, an example will be cited and described where the current sensor 1 is attached to the existing current line X.

First, in a state where the cutout portion 11b in the first support 11 and the cutout portion 21b in the second support 21 are connected and superimposed to and on each other with respect to the current line X extending in a linear fashion, the current line X is led into the insides of the cutout portion 11b in the first support 11 and the second cutout portion 21b (refer to an arrow in FIG. 5A). In addition, in a state where the outer peripheral surface of the current line X comes into contact with the supporting surface 11c of the first support 11 and the supporting surface 21c of the second support 21, the first support 11 and the second support 21 are inversely rotated with respect to each other (in a state where the first support 11 is fixed, the second support is rotated in a direction of an arrow in FIG. 5B). Accordingly, since, as for the current line X, in the axis line direction of the current line X, supporting positions of the current line X, different from each other, are supported by the supporting surfaces 11c and 21c of the first and second supports 11 and 21 from supporting directions different from each other, it may be possible to attach the current line X to the first and second supports 11 and 21. In addition, the connection points 11e and 21e in the first and second supports 11 and 21 come into contact with each other and the first and second magnetic detector element groups 12 and 22 are electrically connected to each other. According to such an operation described above, it may be possible to attach the current line X to the current sensor 1.

In addition, in the current sensor 1 according to the present embodiment, it is desirable that the first magnetic detector element group 12 includes the four magnetic detector elements 12a to 12d provided so as to face each other with being mutually located at equal distances from the current line X and the second magnetic detector element group 22 includes the four magnetic detector elements 22a to 22d provided so as to face each other with being mutually located at equal distances from the current line X. In the current sensor 1, as the number of the magnetic detector elements belonging to the first magnetic detector element group 11 provided in the first support 11 and the magnetic detector elements belonging to the second magnetic detector element group 21 provided in the second support 21 increases, it may be possible to reduce a measurement error when the current line X is out of alignment. On the other hand, when the number of the magnetic detector elements becomes too large, a manufacturing cost increases and it may be difficult to miniaturize the current sensor 1. While depending on measurement accuracy desirable for the current sensor 1, when two sets of four magnetic detector elements exist and the total number thereof is eight, it may be possible to desirably suppress an increase in a manufacturing cost or an increase in the size of the current sensor 1 while it may be possible to desirably enhance the measurement accuracy.

Here, examples of the configurations of the first and second magnetic detector element groups 12 and 22 will be described. The directions of the sensitivity axes of the individual magnetic detector elements 12a to 12d and 22a to 22d may be opposite to each other, for example. Here, the term "the directions of the sensitivity axes are opposite to each other" means that the sensitivity axes of the magnetic detector elements 12a to 12d provided on the top surface side of the first support 11 and the sensitivity axes of the magnetic detector elements 22a to 22d provided on the bottom surface side of the second support 21 individually correspond to the applying direction of the induction magnetic field from the current to be measured that is conducted through the current line X. As the magnetic detector element, a magnetoresistance effect element or a Hall element may be used. In addition, in the present invention, in the case of the Hall element, the term "sensitivity axis" is defined to correspond to a direction perpendicular to a magnetically sensitive surface.

For example, in the first magnetic detector element group 12, a source of electrical potential applying a power source electric potential Vdd is connected to a magnetic detector element on one end side from among the magnetic detector elements 12a to 12d, and a source of electrical potential applying a ground potential GND is connected to a magnetic detector element on the other end side from among the magnetic detector elements 22a to 22d. In the second magnetic detector element group 22, two magnetic detector elements from among the magnetic detector elements 22a to 22d are electrically connected and a sensor output Out is extracted.

As described above, in the current sensor 1 according to the embodiment, since the current line X conducting therethrough the current to be measured is led into the supporting surfaces 11c and 21c through the cutout portions 11b and 21b in the first and second supports 11 and 21 and the corresponding supporting surfaces 11c and 21c support positions of the current line X, different from each other, in the axis line direction of the current line X, it may be possible to attach and detach a current sensor to and from an existing current line. In addition, since the first magnetic detector element group 12 is provided in the first support 11 and the second magnetic detector element group 22 is provided in the second support 21, it may be possible to control positional accuracy between the first and second magnetic detector element groups 12 and 22 and the current line X with a high level. Furthermore, since the cutout portions 11b and 21b are provided in the first and second supports 11 and 21, it may also be possible to attach and detach the current sensor to and from the current line X when the first and second magnetic detector element groups 12 and 22 including the plural magnetic detector elements are provided. As a result, it may be possible to realize a current sensor having a high detection sensitivity and high measurement accuracy. In addition, since no magnetic core is disposed around the current line, it may also be possible to realize the miniaturization of the current sensor 1.

In addition, while, in the above-mentioned embodiment, an example has been described where the shapes of the supporting surfaces 11c and 21c are substantially semicircular shapes in planar view, the shape of the supporting surface 11c is not limited to this and may be arbitrarily modified if the shape of the supporting surface 11c is a shape capable of supporting the outer peripheral surface of the current line X led into the inside of the cutout portion 11b.

Figure 6:
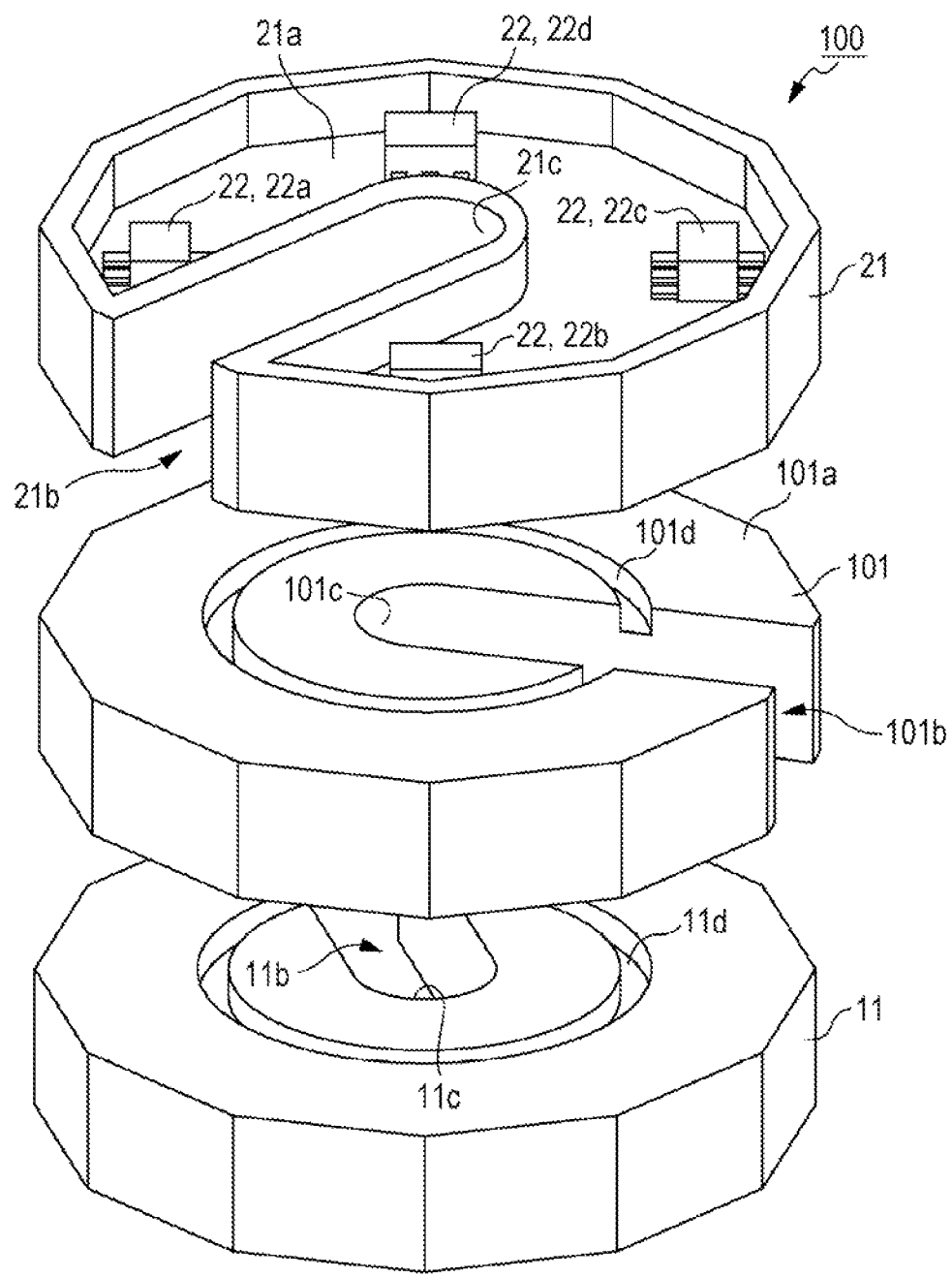
FIG. 6 is an external appearance perspective view of a current sensor according to the above-mentioned embodiment.

In addition, while, in the above-mentioned embodiment, the configuration of the current sensor including the two first and second supports 11 and 21 has been described, a current sensor may be configured using three or more supports. FIG. 6 is the external appearance perspective view of a current sensor 100 including three supports. In addition, in FIG. 6, the same symbol is assigned to the same configuration element as that in the current sensor 1.

Figure 7A:
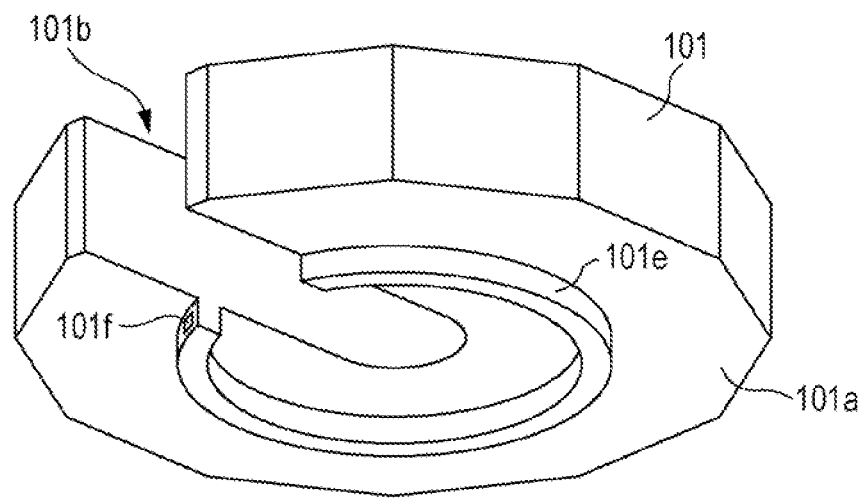
FIGS. 7A and 7B are external appearance perspective views of a third support in the current sensor according to the above-mentioned embodiment.
Figure 8:
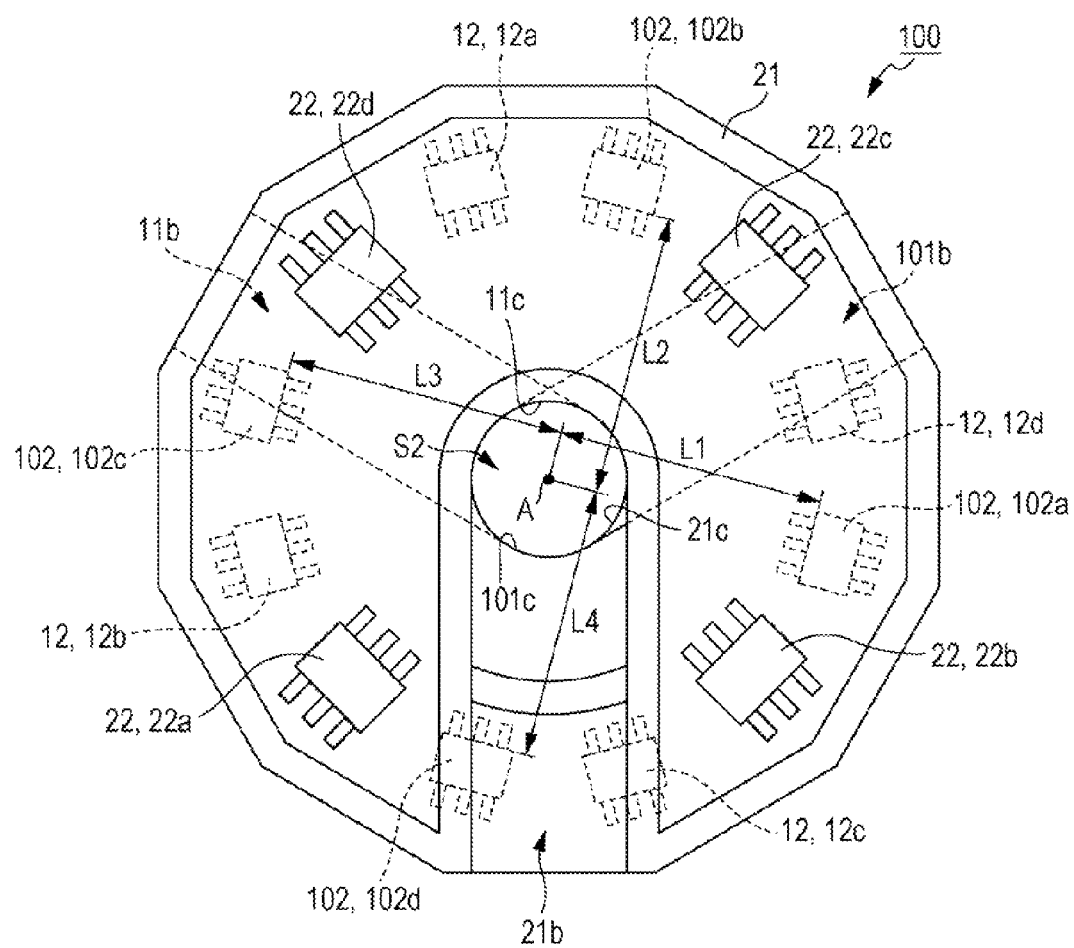
FIG. 8 is a plan pattern diagram of the current sensor according to the above-mentioned embodiment.

As illustrated in FIG. 6, the current sensor 100 includes a third support 101 rotatably fixed between the first support 11 and the second support 21 and a third magnetic detector element group 102 including a plurality of magnetic detector elements that are provided on the third support 101 and output output signals owing to an induction magnetic field from a current to be measured (refer to FIG. 8). The top surface and the bottom surface of the third support 101 are coated, and a substrate-housing space (not illustrated) is formed therewithin. The shape of the substrate-housing space (a shape viewed from above the plane of paper of FIG. 6) is similar to the shape of the third support 101. In the substrate-housing space in the third support 101, the third magnetic detector element group 102 is provided through an insulating substrate (not illustrated). The insulating substrate (not illustrated) has a similar shape slightly smaller than the shape of the substrate-housing space, and is placed within the substrate-housing space. The individual magnetic detector elements belonging to the third magnetic detector element group 102 are provided in the circumferential direction of the current line X. In addition, in the third support 101, a circular concave portion 101d is provided that is dented from the top surface thereof downward. This concave portion 101d is formed with a size being large enough for the convex portion 21d in the support base portion 21a described above (not illustrated in FIG. 6: refer to FIG. 2) to be inserted into so as to be movable in the concave portion 101d. In addition, in the third support 101, a circular convex portion 101e (not illustrated in FIG. 6: refer to FIG. 7A) is provided that protrudes from the bottom surface thereof downward and has a shape complementary to the concave portion 101d. This convex portion 101e is formed with a size being able to be inserted into the concave portion 11d in the above-mentioned support base portion 11a.

Figure 7B:
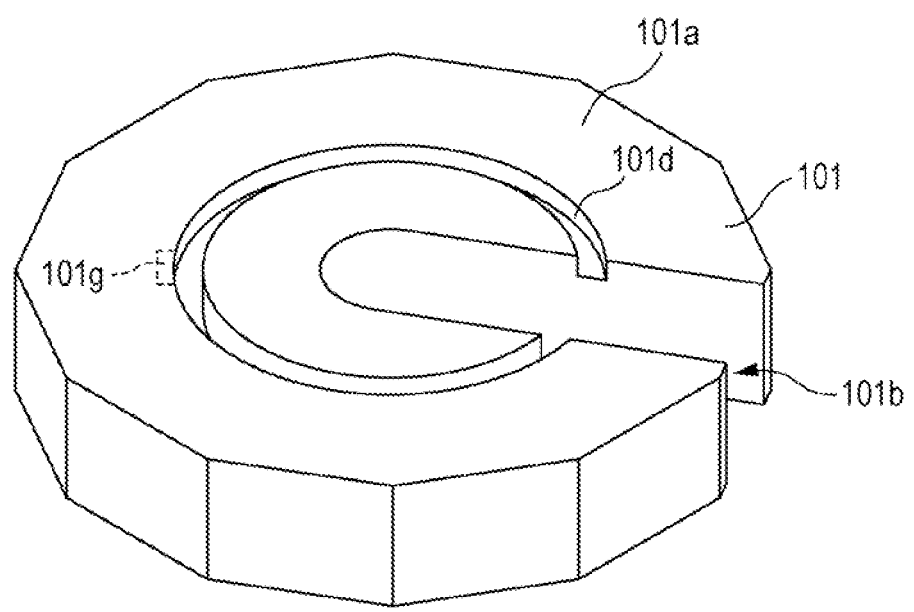

FIGS. 7A and 7B are the external appearance perspective view of the third support 101, FIG. 7A illustrates the bottom surface side of the third support 101, and FIG. 7B illustrates the top surface side of the third support 101.

As illustrated in FIGS. 7A and 7B, the third support 101 includes a support base portion 101a having a substantially plate shape and a cutout portion 101b provided so as to be headed from the outer circumferential portion of the support base portion 101a to the central portion thereof. The third cutout portion 101b has a width dimension slightly larger than the diameter of the current line X conducting therethrough the current to be measured, and is provided so as to lead the current line X from the outer circumferential portion of the support base portion 101a toward the central portion thereof.

In the cutout portion 101b, a third supporting surface 101c is provided that extends from the side wall of the outer circumferential portion of the support base portion 101a and supports the current line X led into the inside of the cutout portion 101b. In the present embodiment, the supporting surface 101c is provided as a circumferential surface having a substantially semicircular shape in planar view, so as to have a complementary shape following the outer peripheral surface of the current line X whose cross-section has a substantially circular shape. In addition, while being described in detail later, when the current line X is attached to the current sensor 100, a portion of the outer peripheral surface of the current line X is supported by the third supporting surface 101c and positioned in a radial direction.

In the third support 101, the third magnetic detector element group 102 is provided through an insulating substrate (not illustrated) (refer to FIG. 8). The third magnetic detector element group 102 includes four magnetic detector elements 102a to 102d outputting output signals owing to an output signal from the current to be measured. The four magnetic detector elements 102a to 102d belonging to the third magnetic detector element group 102 are provided at substantially equal intervals (substantially equal distances) in the circumferential direction of the current line X (refer to FIG. 8). The individual magnetic detector elements 102a to 102d are electrically connected through a wiring pattern (not illustrated). In addition, each of the magnetic detector elements 102a to 102d may have an attachment error not large enough to greatly deteriorate measurement accuracy.

On the top surface side of the support base portion 101a, in the circumferential direction of the current line X, the concave portion 101d is provided that is dented from the top surface of the support base portion 101a downward. This concave portion 101d is provided so as to fit into the convex portion 21d in the second support 21. In addition, in the concave portion 101d, a connection point 101g is provided so as to fit into the connection point 21e in the convex portion 21d in the second support 21 and electrically establish a connection between the third magnetic detector element group 102 and the second magnetic detector element group 22 when the current line X is attached to the first, second, and third supports 11, 21, and 101.

In the bottom surface side of the support base portion 101a, in the circumferential direction of the current line X, a convex portion 101e is provided that protrudes from the bottom surface of the support base portion 101a downward. This convex portion 101e is formed so as to fit into the concave portion 11d in the first support 11. In addition, in the convex portion 101e, a connection point 101f is provided so as to fit into the connection point 11e in the concave portion 11d in the first support 11 and electrically establish a connection between the third magnetic detector element group 102 and the first magnetic detector element group 12 when the current line X is attached to the first, second, and third supports 11, 21, and 101.

In the current sensor 100 according to the present embodiment, the first, second, and third supports 11, 21, and 101 are fixed in a state where the first, second, and third supports 11, 21, and 101 mutually rotate with the axis line direction of the current line X serving as a rotation axis and the first, second, and third cutout portions 11b, 21b, and 101b are connected and superimposed to and on each other. At this time, a state occurs where the convex portion 101e in the third support 101 fits into the concave portion 11d in the first support base portion 11a, and a state occurs where the convex portion 21d in the second support 21 fits into the concave portion 101d in the third support base portion 101. In this state, the current line X is led into the first, second, and third supporting surfaces 11c, 21c, and 101c. In addition, in a state where the current line X comes into contact with the first, second, and third supporting surfaces 11c, 21c, and 101c, the first, second, and third supports 11, 21, and 101 mutually rotate with the axis line direction of the current line X serving as a rotation axis. At this time, the convex portion 21d in the second support 21 fits into the concave portion 101e in the third support 101, and the convex portion 101d in the third support 101 moves in a rotation direction in a state of fitting into the concave portion 11d in the first support base portion 11a. In addition, in the axis line direction of the current line X, the first, second, and third supporting surfaces 11c, 21c, and 101c are fixed so as to support the positions of the current line X different from one another from different directions, and attached to the current line X.

Next, with reference to FIG. 8, the disposition of the first, second, and third magnetic detector element groups 12, 22, and 102 will be described in detail. FIG. 8 is the plan pattern diagram of the current sensor 100.

As illustrated in FIG. 8, the four magnetic detector elements 102a to 102d belonging to the third magnetic detector element group 102 are provided in the circumferential direction of the current line X so that intervals between the individual magnetic detector elements 102a to 102d adjacent to each other are substantially equal intervals with respect to each other. In the present embodiment, one pair of the magnetic detector elements 102a and 102c is provided so as to face each other across the axis A of the current line X, and the other pair of the magnetic detector elements 102b and 102d is provided so as to face each other across the axis A of the current line X and be perpendicular to the pair of the magnetic detector elements 102a and 102c. The individual magnetic detector elements 102a to 102d are provided so that distances L1 to L4 between the axis A of the current line X and the individual magnetic detector elements 102a to 102d are substantially equal distances with respect to one another. By providing in such a way, the individual magnetic detector elements 102a to 102d are provided on the third support 101 at intervals of approximately 90 degrees with respect to each other in the circumferential direction of the current line X.

In the current sensor 100 according to the present embodiment, in a state where the cutout portion 11b in the first support 11, the cutout portion 21b in the second support 21, and the cutout portion 101b in the third support 101 are connected and superimposed to and on each other with respect to the current line X extending in a linear fashion, the current line X is led into the insides of the cutout portions 11b, 21b, and 101b. In addition, in a state where the outer peripheral surface of the current line X comes into contact with the supporting surface 11c of the first support 11, the supporting surface 21c of the second support 21, and the supporting surface 101c of the third support 101, the first support 11, the second support 21, and the third support 101 are inversely rotated with respect to each other. As a result, since, as for the current line X, in the axis line direction of the current line X, supporting positions of the current line X, different from one another, are supported by the supporting surfaces 11c, 21c, and 101c of the first, second, and third supports 11, 21, and 101 from supporting directions different from one another, it may be possible to attach the current line X to the first, second, and third supports 11, 21, and 101. In addition, the connection points 11e, 21e, and 101e in the first, second, and third supports 11, 21, 101 come into contact with each other and the first, second, and third magnetic detector element groups 12, 22, and 102 are electrically connected to each other. According to such an operation described above, it may be possible to attach the current line X to the current sensor 100.

In the current sensor 100 according to the present embodiment, since the individual magnetic detector elements 12a to 12d, 22a to 22d, and 102a to 102d belonging to the first, second, and third magnetic detector element groups 12, 22, and 102 are provided on the first, second, and third supports 11, 21, and 101, respectively, at intervals of approximately 90 degrees with respect to each other in the circumferential direction of the current line X in planar view, when the current line X is attached, it may be possible to fix the first and second supports 11 and 21 so that the individual magnetic detector elements 12a to 12d, 22a to 22d, and 102a to 102d belonging to the first, second, and third magnetic detector element groups 12, 22, and 102 are out of phase with each other by approximately 30 degrees in the circumferential direction of the current line X. Accordingly, it may be possible to fix the current line with accuracy, and it may be possible to further improve the measurement accuracy of the current sensor.

In addition, in the current sensor 100 according to the present embodiment, it is desirable that the third magnetic detector element group 102 includes the four magnetic detector elements 102a to 102d provided so as to face each other with being mutually located at equal distances from the current line X. Owing to this configuration, it may be possible to desirably suppress an increase in a manufacturing cost or an increase in the size of the current sensor 100 while it may be possible to desirably enhance the measurement accuracy.

In addition, in the current sensor 100 according to the present embodiment, the first, second, and third supports 11, 21, and 101 are fixed so that the cutout portions 11b, 21b, and 101b are out of phase with each other by approximately 120 degrees in the circumferential direction of the current line X when the current line X is attached. Accordingly, owing to the supporting surfaces 11c, 21c, and 101c of the first, second, and third supports 11, 21, and 101 forming circumferential surfaces following the outer peripheral surface of the current line X, the shape of a connection hole S2 formed in the cutout portions 11b, 21b, and 101b becomes a substantially circular shape in planar view (refer to FIG. 8). As a result, since positional accuracy between the current line X and each of the magnetic detector elements 12a to 12d, 22a to 22d, and 102a to 102d may be improved when the current line X is attached, it may be possible to improve the measurement accuracy of the current sensor 100. In addition, if the cutout portions 11b, 21b, 101b are out of phase with each other by 90 degrees or more, the shape of the connection hole S2 becomes a circular shape in planar view. Therefore, it may be possible to obtain the same advantageous effect.

(Second Embodiment)

Next, a second embodiment of the present invention will be described. In a current sensor 2 according to the present embodiment, a plurality of magnetic detector element groups are provided in a concentric fashion with respect to a current line, and the individual magnetic detector element groups are mutually provided on substantially the same circumference of circle (within substantially the same plane). In addition, hereinafter, differences from the current sensor 1 according to the first embodiment will be mainly described and the duplication of description will be avoided.

Figure 9:
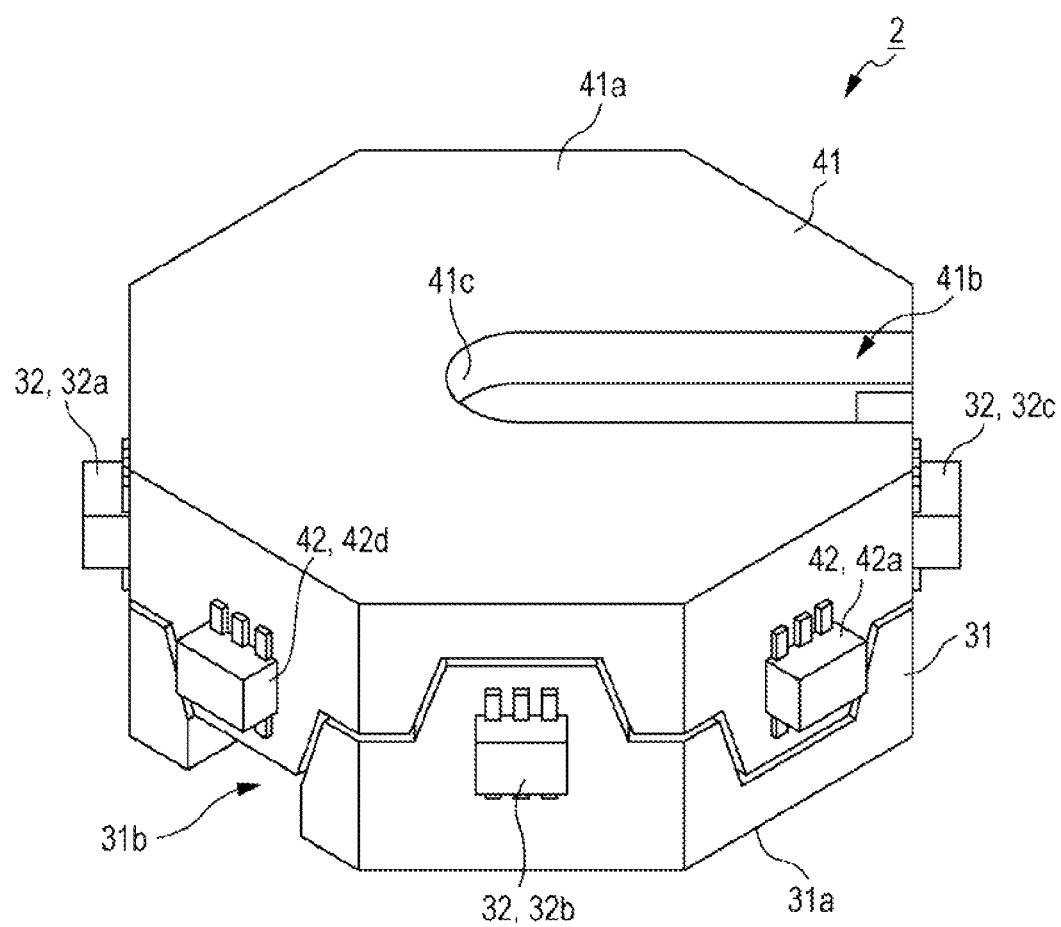
FIG. 9 is an external appearance perspective view of a current sensor according to a second embodiment.
Figure 10:
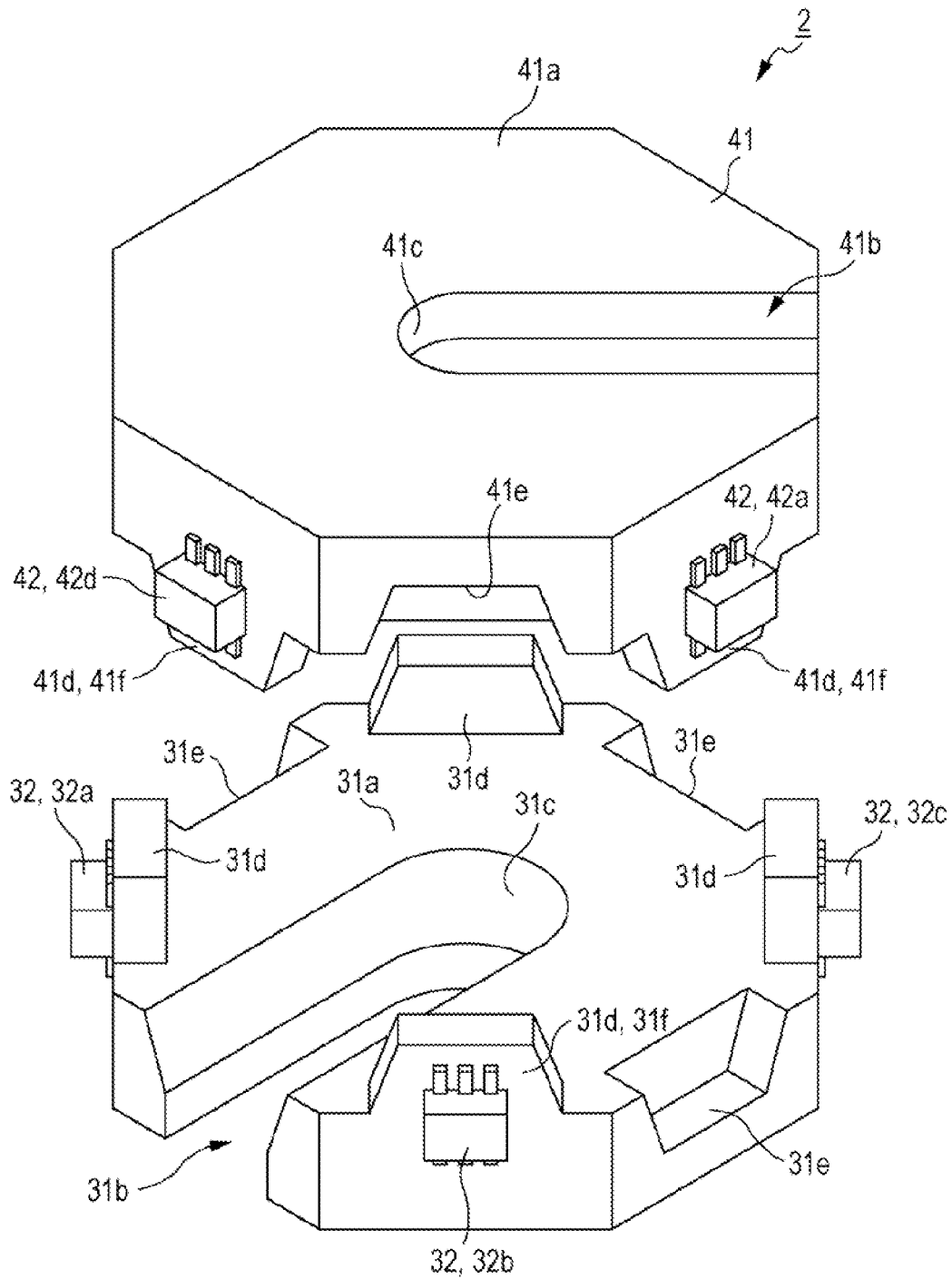
FIG. 10 is an exploded perspective view of the current sensor according to the above-mentioned embodiment.

FIG. 9 is the external appearance perspective view of the current sensor 2 according to the second embodiment of the present invention, and FIG. 10 is the exploded perspective view of the current sensor 2 according to the present embodiment.

As illustrated in FIG. 9 and FIG. 10, the current sensor 2 includes a pair of first and second supports 31 and 41 that have a same configuration and are configured so as to be able to be engaged with each other, a first magnetic detector element group 32 provided on the outer peripheral surface of the first support 31, and a second magnetic detector element group 42 provided on the outer peripheral surface of the second support 41. The first magnetic detector element group 32 includes four magnetic detector elements 32a to 32d outputting output signals owing to an induction magnetic field from a current to be measured, and the second magnetic detector element group 42 includes four magnetic detector elements 42a to 42d outputting output signals owing to the induction magnetic field from the current to be measured. The magnetic detector elements 32a to 32d and 42a to 42d belonging to the first and second magnetic detector element groups 32 and 42 are provided so as to be placed at substantially equal intervals (substantially equal distances) in the circumferential direction of the current line X when the current sensor 2 is attached to the current line X. In addition, each of the magnetic detector elements 32a to 32d and 42a to 42d may have an attachment error not large enough to greatly deteriorate measurement accuracy.

Figure 11:
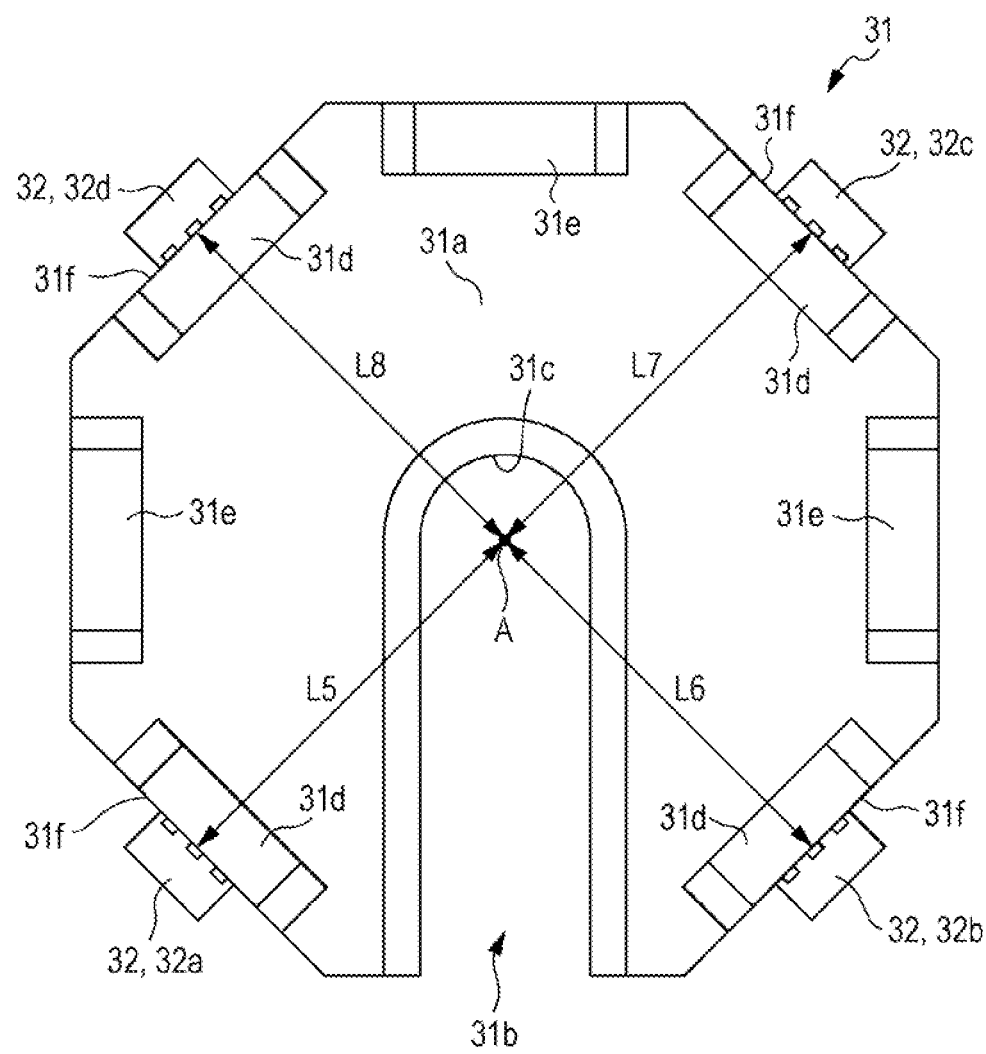
FIG. 11 is a plan view of a first support in the current sensor according to the above-mentioned embodiment.

Next, the configurations of the first and second supports 31 and 41 will be described in detail. Here, while the configuration of the first support 31 will be mainly described, the second support 41 also has the same configuration. FIG. 11 is the plan view of the first support 31.

The first support 31 includes a support base portion 31a having a substantially plate shape and a cutout portion 31b provided so as to be headed from the outer circumferential portion of the support base portion 31a to the central portion thereof. In the cutout portion 31b, a supporting surface 31c is provided that extends from the outer peripheral surface of the support base portion 31a and supports the current line X led from the outer circumferential portion of the support base portion 31a into the inside of the cutout portion 31b. In the present embodiment, the supporting surface 31c is provided as a circumferential surface having a substantially semicircular shape in planar view, so as to have a shape following the outer peripheral surface of the current line X whose cross-section has a substantially circular shape.

In the outer circumferential portion of the support base portion 31a in the first support 31, four convex portions 31d are provided that protrude from the top surface of the support base portion 31a upward. Between the individual convex portions 31d, a concave portion 31e dented from the top surface of the support base portion 31a downward or the cutout portion 31b is provided. The convex portions 31d and the concave portions 31e or the cutout portion 31b in the first support 31 are provided at substantially equal intervals in the circumferential direction of the current line X.

The convex portion 31d in the first support 31 is provided so that the convex portion 31d in the first support 31 and a concave portion 41e or a cutout portion 41b in the second support 41 fit into each other when the first and second supports 31 and 41 are superimposed on each other. The concave portion 31e in the first support 31 is provided so that the concave portion 31e in the first support 31 and a convex portion 41d in the second support 41 fit into each other when the first and second supports 31 and 41 are superimposed on each other. In addition, in each of the first and second supports 31 and 41, a contact portion (not illustrated) is provided in a contact surface when the first and second supports 31 and 41 are engaged with each other, and the contact portion is configured so that the first and second magnetic detector element groups 32 and 42 are electrically connected to each other.

The four magnetic detector elements 32a to 32d belonging to the first magnetic detector element group 32 are provided in the lateral surface 31f of the convex portion 31d, which extends from the outer peripheral surface of the support base portion 31a in the first support 31. In addition, the four magnetic detector elements 32a to 32d are provided so that distances between the axis A of the current line X and the individual magnetic detector elements 32a to 32d are substantially equal distances with respect to one another. In addition, the individual magnetic detector elements 32a to 32d are provided in the circumferential direction of the current line X so that intervals between the individual magnetic detector elements 32a to 32d adjacent to each other are substantially equal intervals with respect to each other.

The four magnetic detector elements 42a to 42d belonging to the second magnetic detector element group 42 are provided in the lateral surface 41f of the convex portion 41d, which extends from the outer peripheral surface of the support base portion 41a in the first support 41. In addition, the four magnetic detector elements 42a to 42d are provided so that distances between the axis A of the current line X and the individual magnetic detector elements 42a to 42d are substantially equal distances with respect to one another. In addition, the individual magnetic detector elements 42a to 42d are provided in the circumferential direction of the current line X so that intervals between the individual magnetic detector elements 42a to 42d adjacent to each other are substantially equal intervals with respect to each other.

In addition, the individual magnetic detector elements 32a to 32d and 42a to 42d belonging to the first and second magnetic detector element groups 32 and 42 are provided in the lateral surfaces 31f and 41f of the convex portions 31d and 41d in the first and second supports 31 and 41 so as to be placed within substantially the same plane (on substantially the same circumference of circle) perpendicular to the axis line direction of the current line X when the current line X is attached to the first and second supports 31 and 41.

In the present embodiment, as for the convex portions 31d and 41d in the first and second supports, one pair of convex portions 31d or 41d is provided so as to face each other across the axis A of the current line X, and the other pair of convex portions 31d or 41d is provided so as to face each other across the axis A of the current line X and be perpendicular to the one pair of the convex portions 31d or 41d. In addition, the convex portions 31d and 41d are provided so that distances L1 to L4 between the axis A of the current line X and the lateral surfaces 31f and 41f are substantially equal distances with respect to one another. By providing the convex portions 31d and 41d in such a way, distances between the magnetic detector elements 32a to 32d provided on the lateral surface 31f of the convex portion 31d and the current line X and distances between the four magnetic detector elements 42a to 42d provided on the lateral surface 41f of the convex portion 41d and the current line X become substantially equal distances with respect to one another (refer to L5 to L8).

In the current sensor 2 according to the present embodiment, the first and second supports 31 and 41 are fixed in a state where the first and second supports 31 and 41 mutually rotate with the axis line direction of the current line X serving as a rotation axis and the first and second cutout portions 31b and 41b are connected and superimposed to and on each other, and the current line X is led into the first and second supporting surfaces 31c and 41c. In addition, when the current line X is attached, the first and second supports 31 and 41 are engaged with each other owing to the convex portions 31d and 41d and the concave portions 31e and 41e in the first and second supports 31 and 41, and attached to the current line X. As a result, when the first and second supports 31 and 41 are attached to the current line X, the individual magnetic detector elements 32a to 32d and 42a to 42d belonging to the first and second magnetic detector element groups 32 and 42 are provided so as to belong within substantially the same plane (on substantially the same circumference of circle) perpendicular to the axis line direction of the current line X. If the first magnetic detector element group 32 and the second magnetic detector element group 42 are disposed in separate planes, when the current line X tilts, a direction and a distance where the current line X is displaced from the center of the first magnetic detector element group 32 and a direction and a distance where the current line X is displaced from the center of the second magnetic detector element group 42 are different from each other. In such a case, even if the displacement is small, the measurement accuracy is greatly deteriorated. In the current sensor 2 according to the present embodiment, since the first and second magnetic detector element groups 32 and 42 are provided on substantially the same circumference of circle (within substantially the same plane), even if the current line X tilts, a direction and a distance where the current line X is displaced with respect to the first magnetic detector element group 32 are substantially the same as those with respect to the second magnetic detector element group 42. Therefore, it may be possible to avoid the deterioration of the measurement accuracy of the current sensor 2.

Next, the attachment of the current sensor 2 to the current line X will be described with reference to FIGS. 12A and 12B. As illustrated in FIGS. 12A and 12B, when the current line X is attached to the current sensor 2, the cutout portions 31b and 41b in the first and second supports 31 and 41 are connected and superimposed to and on each other, and in a state where the convex portions 31d and 41d face each other, the current line X is led into the supporting surfaces 31c and 41c through the first cutout portions 31e and 41e (refer to an arrow in FIG. 12A). In addition, in a state where the current line X comes into contact with the supporting surfaces 31c and 41c, the first and second supports 31 and 41 are rotated in directions opposite to each other (in a state where the first support 31 is fixed, the second support 41 is rotated in a direction of an arrow in FIG. 12B), thereby causing the concave portion 31e and the convex portion 31d in the first support 31 and the concave portion 41e and the convex portion 41d in the second support 41 to fit into each other. In the current sensor 2, since, by causing the convex portions 31d and 41d in the first and second supports 31 and 41 to come into contact with each other, it may be possible to connect and superimpose the cutout portions 31e and 41e to and on each other, it may be possible to easily attach the current sensor 2 to the current line X.

In this way, in the current sensor 2 according to the present embodiment, distances between the individual magnetic detector elements 32a to 32d and 42a to 42d belonging to the first and second magnetic detector element groups 32 and 42 and the axis A of the current line X are substantially equal distances with respect to one another, and the magnetic detector elements 32a to 32d and 42a to 42d are provided at substantially equal intervals in the circumferential direction of the current line X. Accordingly, since differences between the distances of the magnetic detector elements 32a to 32d and 42a to 42d belonging to the first and second magnetic detector element groups 32 and 42 with respect to the current line X become small, the measurement accuracy may be further improved. In particular, in the current sensor 2, when the current line X is attached to the first and second supports 31 and 41, the magnetic detector elements 32a to 32d and 42a to 42d belonging to the first and second magnetic detector element groups 32 and 42 are placed on substantially the same circumference of circle (within substantially the same plane), it may be possible to miniaturize the current sensor 2. Furthermore, since the first and second magnetic detector element groups 32 and 42 are provided on substantially the same circumference of circle (within substantially the same plane), it may be possible to suppress the deterioration of accuracy when the current line X tilts.

Figure 13:
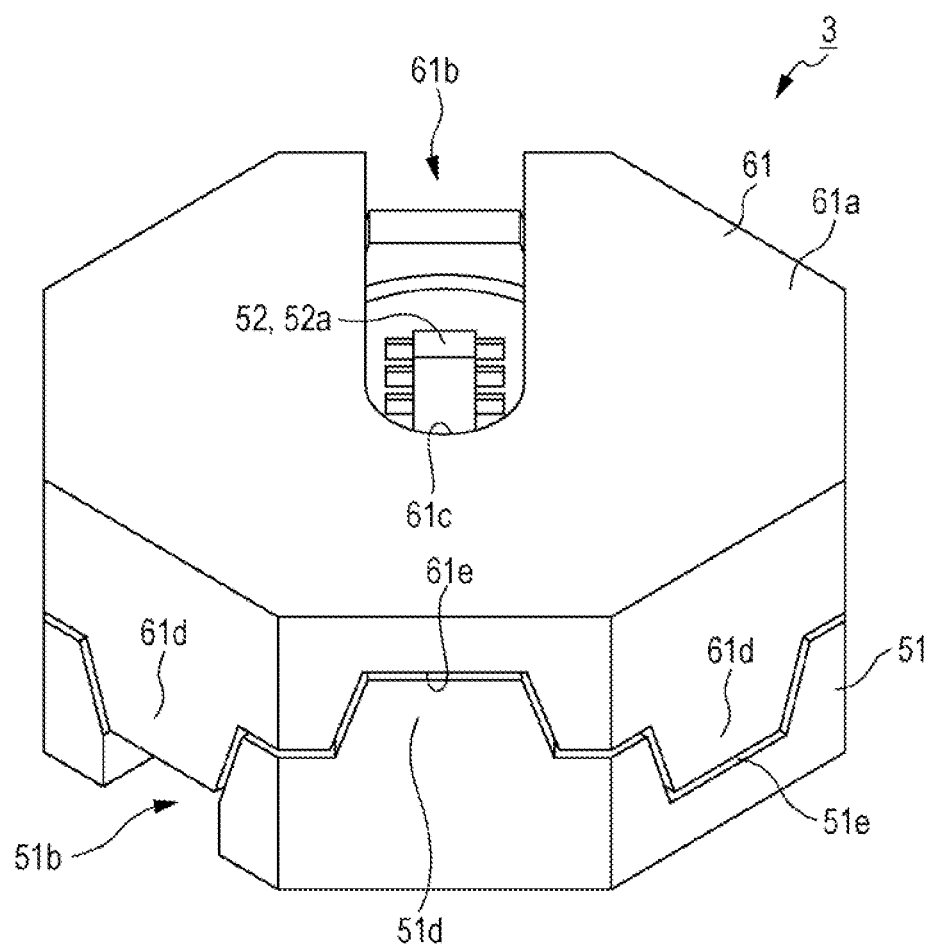
FIG. 13 is an external appearance perspective view of the current sensor according to the above-mentioned embodiment.

Next, an example of another configuration of a current sensor 3 according to the second embodiment of the present invention will be described. FIG. 13 is the external appearance perspective view of the current sensor 3 according to the present example, and FIG. 14 is the exploded perspective view of the current sensor 3.

Figure 14:
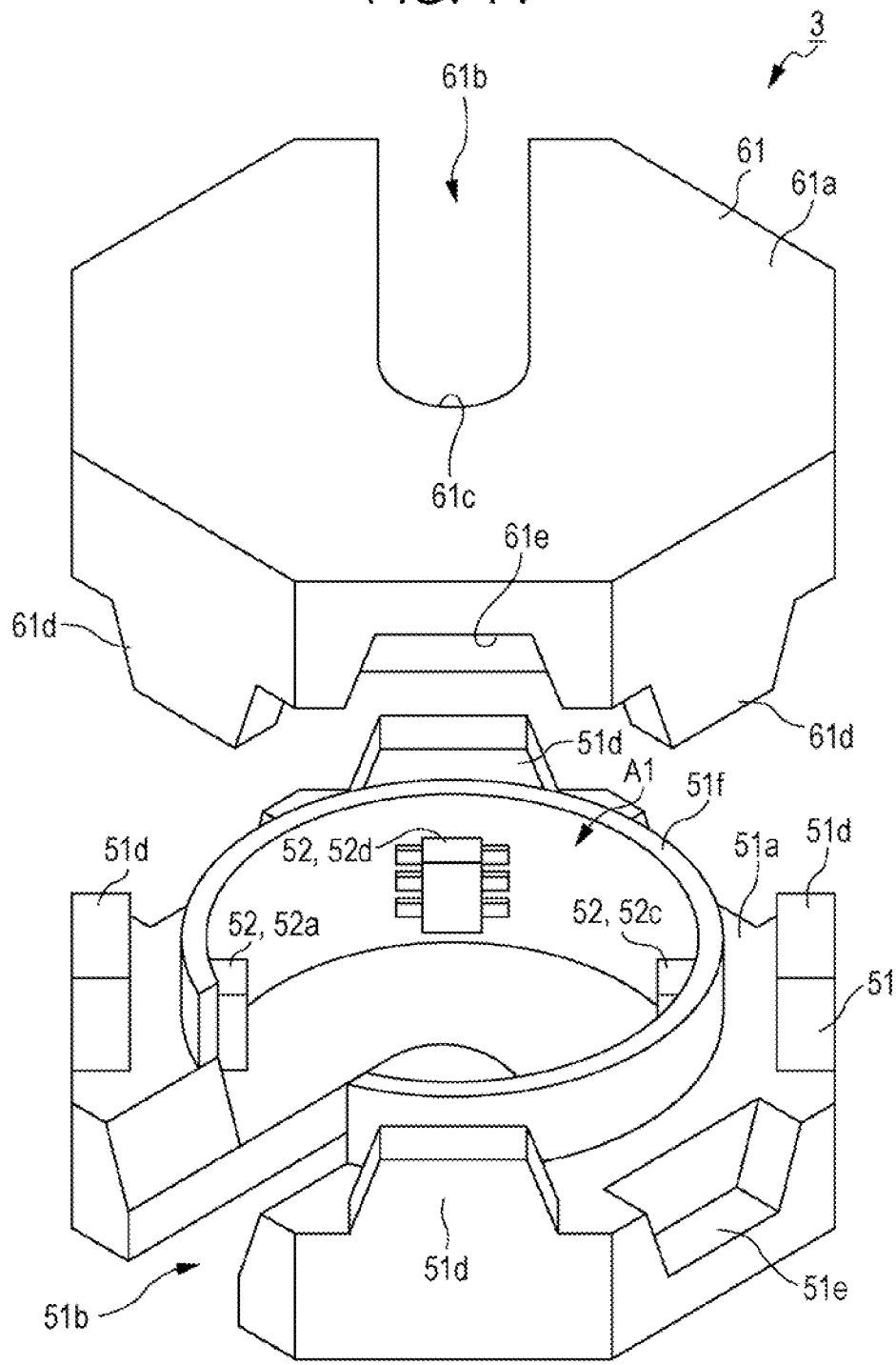
FIG. 14 is an external appearance perspective view of the current sensor according to the above-mentioned embodiment.

As illustrated in FIG. 13 and FIG. 14, the current sensor 3 includes a pair of first and second supports 51 and 61 configured so as to be able to be engaged with each other, a first magnetic detector element group 52 provided in the first support 51, and a second magnetic detector element group 62 provided in the second support. In the current sensor 3, in a state where the first and second supports 51 and 61 are engaged with each other, the first and second magnetic detector element groups 52 and 62 are provided within substantially the same plane (on substantially the same circumference of circle) perpendicular to the axis line direction of the current line X, and the first and second magnetic detector element groups 52 and 62 are provided within the current sensor 3.

Figure 15A:
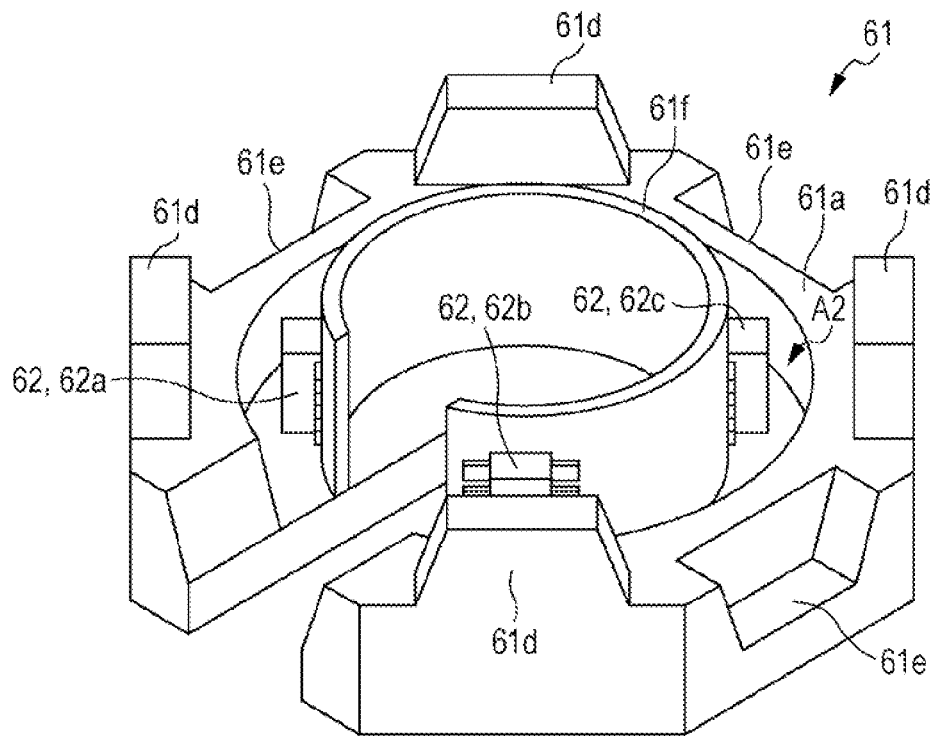
FIGS. 15A and 15B are external appearance perspective views of a first support and a second support in the current sensor according to the above-mentioned embodiment.
Figure 15B:
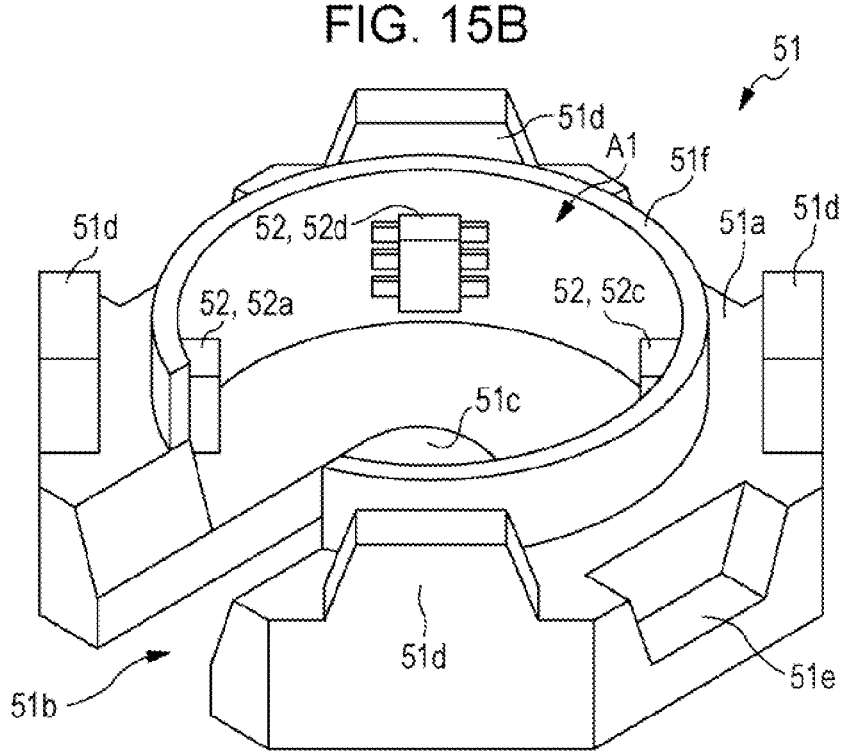
Figure 16A:
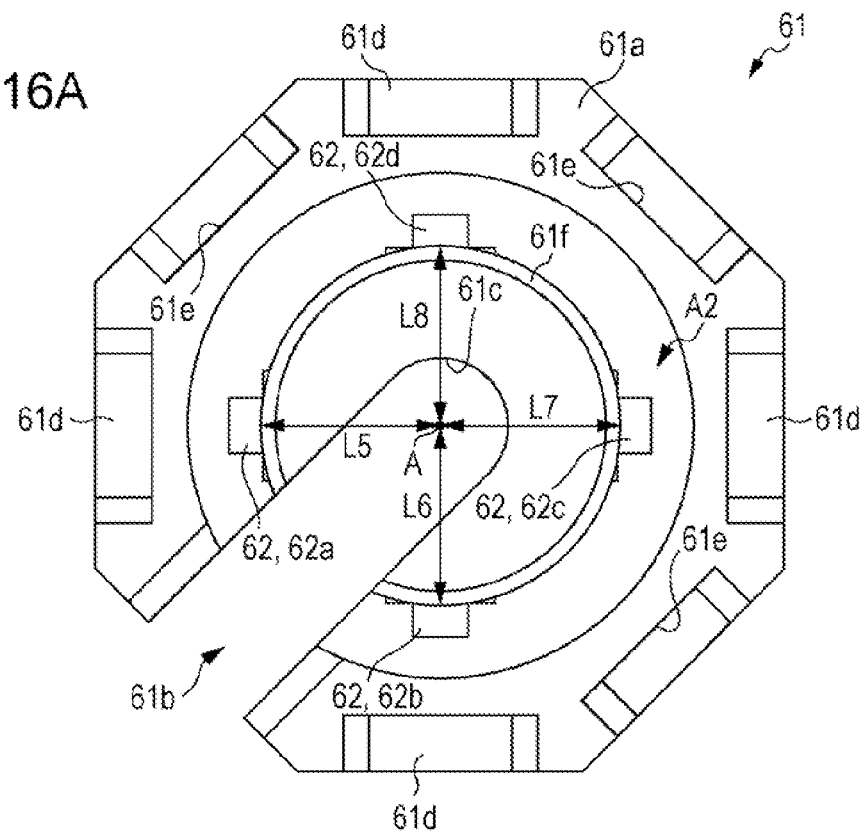
FIGS. 16A and 16B are plan views of the first and second supports in the current sensor according to the above-mentioned embodiment.
Figure 16B:
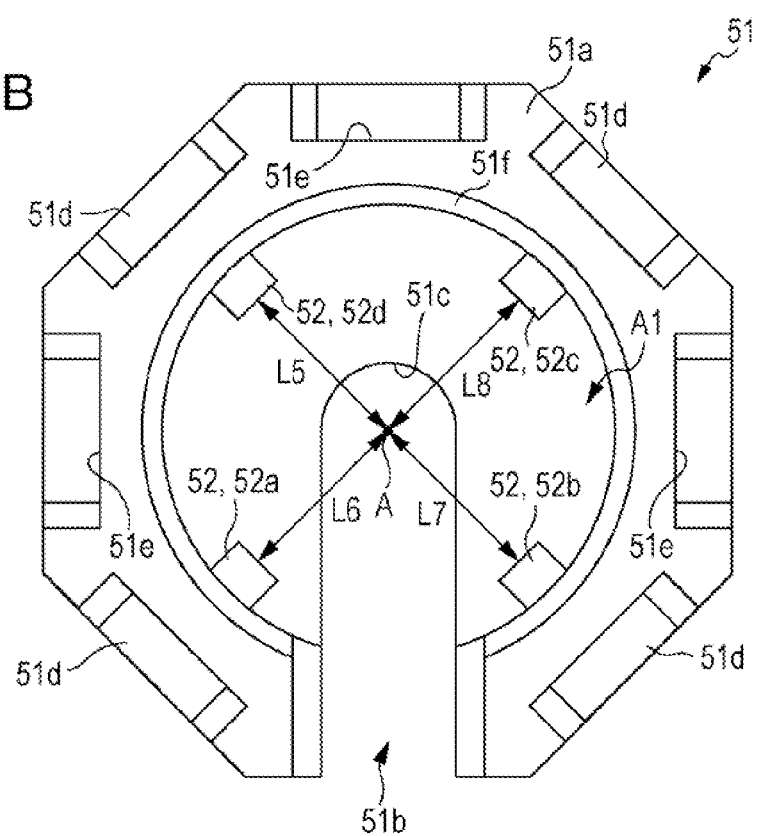

FIGS. 15A and 15B are the external appearance perspective views of the first and second supports 51 and 61, and FIGS. 16A and 16B are the plan views of the first and second supports 51 and 61. As illustrated in FIGS. 15A and 15B and FIGS. 16A and 16B, the first support 51 includes a support base portion 51a having a substantially plate shape and a cutout portion 51b provided so as to be headed from the outer circumferential portion of the support base portion 51a to the central portion thereof. The cutout portion 51b has a width dimension slightly larger than the diameter of the current line X conducting therethrough the current to be measured, and is provided so as to lead the current line X from the outer circumferential portion of the support base portion 51a toward the central portion thereof.

In the cutout portion 51b, a supporting surface 51c is provided that extends from the outer peripheral surface of the support base portion 51a and supports the current line X led into the inside of the cutout portion 51b. In the present embodiment, the supporting surface 51c is provided as a circumferential surface having a substantially semicircular shape in planar view, so as to have a shape following the outer peripheral surface of the current line X whose cross-section has a substantially circular shape.

In the outer circumferential portion of the support base portion 51a, four convex portions 51d are provided that protrude from the top surface of the support base portion 51a upward. Between the individual convex portions 51d, a concave portion 51e dented from the top surface of the support base portion 51a downward or the cutout portion 51b is provided. The convex portions 51d and the concave portions 51e or the cutout portion 51b in the first support 51 are provided at substantially equal distances in the circumferential direction of the current line X. The convex portion 51d in the first support 51 is provided so that the convex portion 51d in the first support 51 and an after-mentioned concave portion 61e in the second support 61 fit into each other, and the concave portion 51e is provided so that the concave portion 51e and a convex portion 61d in the second support 61 fit into each other.

The second support 61 includes a support base portion 61a having a substantially plate shape and a cutout portion 61b provided so as to be headed from the outer circumferential portion of the support base portion 61a to the central portion thereof. The cutout portion 61b has a width dimension slightly larger than the diameter of the current line X conducting therethrough the current to be measured, and is provided so as to lead the current line X from the outer circumferential portion of the support base portion 61a toward the central portion thereof.

In the cutout portion 61b, a supporting surface 61c is provided that extends from the outer peripheral surface of the support base portion 61a and supports the current line X led into the inside of the cutout portion 61b (refer to FIG. 13 and FIG. 14). In the present embodiment, the supporting surface 61c is provided as a circumferential surface having a substantially circular shape in planar view, so as to have a shape following the outer peripheral surface of the current line X whose cross-section has a substantially circular shape.

In the outer circumferential portion of the support base portion 61a, four convex portions 61d are provided that protrude from the top surface of the support base portion 61a upward. Between the individual convex portions 61d, a concave portion 61e dented from the top surface of the support base portion 61a downward or the cutout portion 61b is provided. The convex portions 61d and the concave portions 61e or the cutout portion 61b in the second support 61 are provided at substantially equal distances in the circumferential direction of the current line X. The convex portion 61d in the second support 61 is provided so that the convex portion 61d in the second support 61 and the concave portion 51e in the first support 51 fit into each other, and the concave portion 61e is provided so that the concave portion 61e and the convex portion 51d in the first support 51 fit into each other.

In the central portion of the support base portion 51a in the first support 51, in the circumferential direction of the current line X, a circular inner wall 51f (first inner wall portion) is provided that protrudes from the top surface of the support base portion 51a upward. In a region on the inside of the inner wall 51f, a housing space A1 is provided that is dented from the top surface of the support base portion 51a downward. In the housing space A1, when the current line X is attached to the first and second supports 51 and 61, the lower end side of a circular inner wall 61f (second inner wall portion) is housed from among the first and second supports 51 and 61 engaged with each other, the circular inner wall 61f protruding from the top surface of the second support 61 upward and having a shape similar to the inner wall 51f.

Four magnetic detector elements 52a to 52d belonging to the first magnetic detector element group 52 are provided on the inside of the inner wall 51f. In the present embodiment, the magnetic detector elements 52a to 52d are provided in the inner peripheral surface of the inner wall 51f of the support base portion 51a, at substantially equal intervals in the circumferential direction of the current line X. In the present embodiment, the individual magnetic detector elements 52a to 52d are provided so that distances L5 to L8 between the axis A of the current line X and the individual magnetic detector elements 52a to 52d are substantially equal distances with respect to one another, and the individual magnetic detector elements 52a to 52d are provided in the circumferential direction of the current line X so that intervals between the individual magnetic detector elements 52a to 52d adjacent to each other are substantially equal intervals with respect to each other. In addition, each of the magnetic detector elements 52a to 52d may have an attachment error not large enough to greatly deteriorate measurement accuracy.

In the central portion of the support base portion 61a in the second support 61, a housing space A2 is provided that is dented from the top surface of the second support 61 downward. This housing space A2 is provided so as to have a substantially circular shape in planar view, and provided so as to have a width dimension in a radial direction slightly larger than the outer peripheral surface of the inner wall 51f of the first support 51 and have a shape similar to A1. In the housing space A2, when the first and second supports 51 and 61 are engaged with each other, the upper end side of the inner wall 51f is housed, the inner wall 51f protruding from the top surface of the first support 51 toward the second support 61 side.

Within the housing space A2 in the second support 61, in the circumferential direction of the current line X, the inner wall 61f is provided that protrudes from the top surface of the support base portion 61a upward. This inner wall 61f is provided so as to have a width dimension in a radial direction smaller than the inner wall 51f of the first support 51. In other words, the radius of the inner wall 51f in the first support 51 is provided so as to be larger than the radius of the inner wall 61f of the second support 61. The inner wall 61f is provided so that it may be possible to provide the first and second magnetic detector elements 51 and 61 between the inner wall 51f of the first support 51 and the inner wall 61f of the second support 61 when the first and second supports are engaged with each other.

Four magnetic detector elements 62a to 62d belonging to the second magnetic detector element group 62 are provided on the outside of the inner wall 61f. In the present embodiment, the magnetic detector elements 62a to 62d are provided in the outside peripheral surface of the inner wall 61f of the support base portion 61a, at substantially equal intervals in the circumferential direction of the current line X. In the present embodiment, the individual magnetic detector elements 62a to 62d are provided so that distances L5 to L8 between the axis A of the current line X and the individual magnetic detector elements 62a to 62d are substantially equal distances with respect to one another, and the individual magnetic detector elements 62a to 62d are provided in the circumferential direction of the current line X so that intervals between the individual magnetic detector elements 62a to 62d adjacent to each other are substantially equal intervals with respect to each other. In addition, each of the magnetic detector elements 62a to 62d may have an attachment error not large enough to greatly deteriorate measurement accuracy.

In the current sensor 3 according to the present embodiment, the first and second supports 51 and 61 are fixed in a state where the first and second supports 51 and 61 mutually rotate with the axis line direction of the current line X serving as a rotation axis and the first and second cutout portions 51b and 61b are connected and superimposed to and on each other, and the current line X is led into the first and second supporting surfaces 51c and 61c. In addition, when the current line X is attached, the first and second supports 51 and 61 are engaged with each other owing to the convex portions 51d and 61d and the concave portions 51e and 61e in the first and second supports 51 and 61, and attached to the current line X. As a result, when the first and second supports 51 and 61 are attached to the current line X, the individual magnetic detector elements 52a to 52d and 62a to 62d belonging to the first and second magnetic detector element groups 52 and 62 are provided so as to belong within substantially the same plane (on substantially the same circumference of circle) perpendicular to the axis line direction of the current line X. Accordingly, in the same way as the above-mentioned current sensor 2, even if the current line X tilts, the deterioration of the measurement accuracy of the current sensor 3 may be avoided.

In addition, in the current sensor 3 according to the present embodiment, the first magnetic detector element group 52 is provided in the inner wall 51f protruding from the top surface of the support base portion 51a upward, the second magnetic detector element group 62 is provided in the inner wall 61f protruding from the top surface of the support base portion 61a upward, and the first and second supports 51 and 61 are engaged with each other. Therefore, it may be possible to provide the first and second magnetic detector element groups 52 and 62 on substantially the same circumference of circle (within substantially the same plane). Accordingly, it may be possible to improve the measurement accuracy of the current sensor 3. In addition, since it may be possible to provide the first and second magnetic detector element groups 52 and 62 within the first and second supports 51 and 61 engaged with each other, it may be possible to realize downsizing.

In addition, the present invention is not limited to the above-mentioned embodiments, and may be implemented with various modifications being made. The present invention is not limited to sizes, shapes, and the like illustrated in the accompanying drawings in the above-mentioned embodiments, and the sizes, shapes, and the like may be arbitrarily modified within a range where the advantageous effects of the present invention are exerted. Furthermore, the present invention may be implemented with modifications being arbitrarily made without departing from the scope of the invention. In addition, it should be understood that, as for the terms "on a circumference of circle", "equal distance", and "equal interval", a slight displacement may occur in a range where the advantageous effects of the present invention are exerted.

The present invention has an advantageous effect that it may be possible to realize a current sensor capable of having high measurement accuracy and a high detection sensitivity and being attachable and detachable to and from an existing current line, and in particular, may be useful as a current sensor to which an existing current line is attached.

What is claimed is:

1. A current sensor comprising:
    a first support including:
        a first cutout portion configured to guide and receive a current line flowing a current to be measured therethrough; and
        a first supporting surface provided in the first cutout portion and supporting the current line received by the first cutout portion;
    a second support rotatable attached to the first support, the second support being configured to rotate in a circumferential direction of the current line, and including:
        a second cutout portion configured to guide and receive the current line; and
        a second supporting surface provided in the second cutout portion and supporting the current line received by the second cutout portion;
    a first group of magnetic detector elements provided on the first support, the first group including a plurality of magnetic detector elements outputting output signals corresponding to an induction magnetic field from the current to be measured; and
    a second group of magnetic detector elements provided on the second support, the second group including a plurality of magnetic detector elements outputting output signals corresponding to the induction magnetic field,
    wherein the first and second supports guide and receive the current line onto the first and second supporting surfaces, respectively, in a state where the first and second cutout portions are aligned with each other, and when the current line is attached,
    and wherein the first and second supports secure the current line with the first and second supporting surfaces, respectively, at first and second positions of the current line from first and second directions, respectively, the first and second positions being different from each other in an axis direction of the current line, and the first and second directions being different from each other.

2. The current sensor according to claim 1, wherein
    the plurality of magnetic detector elements belonging to the first group and the plurality of magnetic detector elements belonging to the second group are provided at equal intervals in the circumferential direction of the current line, respectively.

3. The current sensor according to claim 2, wherein
    the first support includes first convex portions and first concave portions provided in an outer circumferential portion of the first support,
    the second support includes second convex portions and second concave portions provided in an outer circumferential portion of the second support,
    the plurality of magnetic detector elements belonging to the first group are provided on an outer surface of the first convex portions,
    the plurality of magnetic detector elements belonging to the second group are provided on an outer surface of the second convex portions, and
    when the current line is attached, the first and second supports are secured to each other by engaging the first and second convex portions with the second and first concave portions, respectively, such that the plurality of magnetic detector elements of the first and second groups are positioned along a same circumference of a circle.

4. The current sensor according to claim 2, wherein
    the first support includes:
        first convex portions and first concave portions provided in an outer circumferential portion of the first support; and
        a first inner wall portion having a first radius, provided along the circumferential direction of the current line,
    the second support includes:
        second convex portions and second concave portions provided in an outer circumferential portion of the second support; and
        a second inner wall portion having a second radius, provided along the circumferential direction of the current line, the first radius being greater than the second radius,
    the plurality of magnetic detector elements belonging to the first group are provided on an inner surface of the first inner wall portion,
    the plurality of magnetic detector elements belonging to the second group are provided on an outer surface of the second inner wall portion, and
    when the current line is attached, the first and second supports are secured to each other by engaging the first and second convex portions with the second and first concave portions, respectively, such that the plurality of magnetic detector elements of the first and second groups are positioned along a same circumference of a circle.

5. The current sensor according to claim 3, wherein
    The plurality of magnetic detector elements belonging to the first group and the plurality of magnetic detector elements belonging to the second group are provided at equal intervals along the circumferential direction of the current line.

6. The current sensor according to claim 2, wherein
    the first group of magnetic detector elements includes four magnetic detector elements provided at an equal distance from the current line so as to face each other, and
    the second group of magnetic detector elements includes four magnetic detector elements provided at an equal distance from the current line so as to face each other.

7. The current sensor according to claim 1, wherein
    the first and second supporting surfaces include respective circumferential surfaces following an outer peripheral surface of the current line, and when the current line is attached, the first and second supports are secured to each other such that the first and second cutout portions are shifted by at least 90 degrees in the circumferential direction of the current line.

8. The current sensor according to claim 1, further comprising:
a third support including:
a third cutout portion configured to guide and receive the current line flowing the current to be measured therethrough; and
a third supporting surface provided on the third cutout portion and supporting the current line received by the third cutout portion; and
a third group of magnetic detector elements provided on the third support, the third group including a plurality of magnetic detector elements outputting output signals corresponding to the induction magnetic field,
wherein the first, second, and third supports are configured to guide and receive the current line onto the first, second, and third supporting surfaces, respectively, in a state where the first, second, and third cutout portions are aligned with each other, and when the current line is attached, to secure the current line at first, second, and third positions thereof with the first, second, and third supporting surfaces, respectively, from first, second, and third directions, respectively, the first, second, and third positions being different from one another in the axis direction of the current line, and the first, second, and third directions being different from one another.

9. The current sensor according to claim 8, wherein
the plurality of magnetic detector elements belonging to the third group are provided at equal intervals in the circumferential direction of the current line.

10. The current sensor according to claim 8, wherein
the third group of magnetic detector elements includes four magnetic detector elements provided at an equal distance from the current line so as to face each other.

11. The current sensor according to claim 8, wherein
the first, second, and third supporting surfaces include respective circumferential surfaces following an outer peripheral surface of the current line, and when the current line is attached, the first, second, and third supports are secured to one another such that the first, second, and third cutout portions are shifted by at least 90 degrees in the circumferential direction of the current line.

12. The current sensor according to claim 4, wherein when the first and second supports are secured to each other, the plurality of magnetic detector elements of the first group and the second group are positioned between the first and second inner walls.

* * * * *